United States Patent
Yamazaki et al.

(10) Patent No.: US 7,276,730 B2
(45) Date of Patent: Oct. 2, 2007

(54) SEMICONDUCTOR DEVICE HAVING A PIXEL MATRIX CIRCUIT THAT INCLUDES A PIXEL TFT AND A STORAGE CAPACITOR

(75) Inventors: Shunpei Yamazaki, Tokyo (JP); Yu Yamazaki, Kanagawa (JP); Jun Koyama, Kanagawa (JP); Takayuki Ikeda, Kanagawa (JP); Hiroshi Shibata, Kanagawa (JP); Hidehito Kitakado, Kanagawa (JP); Takeshi Fukunaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/837,877

(22) Filed: Apr. 19, 2001

(65) Prior Publication Data

US 2002/0014624 A1 Feb. 7, 2002

(51) Int. Cl.
*H01L 29/06* (2006.01)
*H01L 29/08* (2006.01)

(52) U.S. Cl. .................. 257/59; 257/350; 257/72; 257/291; 257/443; 257/E29.202; 257/E29.273

(58) Field of Classification Search .......... 257/57, 257/59, 66, 288, 350, 351, 347, 291, 443; 257/E29.202, E29.273; 349/39.42
See application file for complete search history.

(56) References Cited

U.S. PATENT DOCUMENTS

| | | | |
|---|---|---|---|
| 4,609,930 A | 9/1986 | Yamazaki | |
| 4,748,485 A | 5/1988 | Vasudev | |
| 4,977,105 A | 12/1990 | Okamoto et al. | |
| 4,984,033 A | 1/1991 | Ishizu et al. | |
| 4,996,575 A | 2/1991 | Ipri et al. | |
| 5,034,788 A | 7/1991 | Kerr | |
| 5,103,277 A | 4/1992 | Caviglia et al. | |
| 5,124,769 A | 6/1992 | Tanaka et al. | |
| 5,140,391 A | 8/1992 | Hayashi et al. | |
| 5,185,535 A | 2/1993 | Farb et al. | |
| 5,198,379 A | 3/1993 | Adan | |
| 5,233,211 A | 8/1993 | Hayashi et al. | |

(Continued)

FOREIGN PATENT DOCUMENTS

EP   0 178 447   4/1986

(Continued)

OTHER PUBLICATIONS

Peter Van Zant, Microchip Fabrication, 2000, McGraw-Hill, p. 403.*

(Continued)

*Primary Examiner*—Monica Lewis
(74) *Attorney, Agent, or Firm*—Nixon Peabody LLP; Jeffrey L. Costellia

(57) ABSTRACT

In a CMOS circuit formed on a substrate 100, a subordinate gate wiring line (a first wiring line) 102a and main gate wiring line (a second wiring line) 113a are provided in an n-channel TFT. The LDD regions 107a and 107b overlap the first wiring line 102a and not overlap the second wiring line 113a. Thus, applying a gate voltage to the first wiring line forms the GOLD structure, while not applying forms the LLD structure. In this way, the GOLD structure and the LLD structure can be used appropriately in accordance with the respective specifications required for the circuits.

13 Claims, 17 Drawing Sheets

U.S. PATENT DOCUMENTS

| | | | |
|---|---|---|---|
| 5,246,882 A | 9/1993 | Hartmann | |
| 5,273,921 A | 12/1993 | Neudeck et al. | |
| 5,275,972 A | 1/1994 | Ogawa et al. | |
| 5,281,840 A | 1/1994 | Sarma | |
| 5,294,821 A | 3/1994 | Iwamatsu | |
| 5,315,132 A * | 5/1994 | Yamazaki | 257/66 |
| 5,327,001 A | 7/1994 | Wakai et al. | |
| 5,359,219 A | 10/1994 | Hwang | |
| 5,371,398 A | 12/1994 | Nishihara | |
| 5,420,048 A | 5/1995 | Kondo | |
| 5,463,483 A * | 10/1995 | Yamazaki | 359/58 |
| 5,470,793 A | 11/1995 | Kalnitsky | |
| 5,475,238 A | 12/1995 | Hamada | |
| 5,485,019 A * | 1/1996 | Yamazaki et al. | 257/57 |
| 5,506,436 A | 4/1996 | Hayashi et al. | |
| 5,521,107 A * | 5/1996 | Yamazaki et al. | 437/42 |
| 5,532,850 A * | 7/1996 | Someya et al. | 359/59 |
| 5,580,802 A | 12/1996 | Mayer et al. | |
| 5,604,368 A | 2/1997 | Taur et al. | |
| 5,621,224 A * | 4/1997 | Yamazaki et al. | 257/66 |
| 5,643,826 A | 7/1997 | Ohtani et al. | |
| 5,646,424 A * | 7/1997 | Zhang et al. | 257/66 |
| 5,702,963 A | 12/1997 | Vu et al. | |
| 5,807,772 A | 9/1998 | Takemura | |
| 5,818,076 A | 10/1998 | Zhang et al. | |
| 5,917,221 A | 6/1999 | Takemura | |
| 5,923,962 A | 7/1999 | Ohtani et al. | |
| 6,054,734 A | 4/2000 | Aozasa et al. | |
| 6,225,150 B1 | 5/2001 | Lee et al. | |
| 6,252,248 B1 | 6/2001 | Sano et al. | |
| 6,285,042 B1 | 9/2001 | Ohtani et al. | |
| 6,323,068 B1 * | 11/2001 | Seo | 438/154 |
| 6,330,044 B1 | 12/2001 | Murade | |
| 6,335,541 B1 | 1/2002 | Ohtani et al. | |
| 6,362,507 B1 * | 3/2002 | Ogawa et al. | 257/350 |
| 6,365,933 B1 | 4/2002 | Yamazaki et al. | |
| 6,424,012 B1 * | 7/2002 | Kawasaki et al. | 257/350 |
| 6,479,333 B1 | 11/2002 | Takano et al. | |
| 6,534,788 B1 * | 3/2003 | Yeo et al. | 257/72 |
| 6,590,230 B1 | 7/2003 | Yamazaki et al. | |
| 6,603,453 B2 | 8/2003 | Yamazaki et al. | |
| 6,893,503 B1 | 5/2005 | Ohnuma et al. | |
| 6,998,639 B2 | 2/2006 | Ohtani et al. | |
| 7,023,052 B2 | 4/2006 | Yamazaki et al. | |
| 7,138,658 B2 | 11/2006 | Yamazaki et al. | |
| 2001/0030722 A1 * | 10/2001 | Murade | 349/110 |
| 2002/0080295 A1 * | 6/2002 | Someya et al. | 349/43 |
| 2002/0093019 A1 * | 7/2002 | Hirabayashi et al. | 257/71 |
| 2003/0038303 A1 * | 2/2003 | Hashimoto et al. | 257/200 |
| 2006/0131583 A1 | 6/2006 | Ohtani et al. | |

FOREIGN PATENT DOCUMENTS

| | | |
|---|---|---|
| JP | 57-032641 | 2/1982 |
| JP | 58-115850 | 7/1983 |
| JP | 60-081869 | 5/1985 |
| JP | 60-154660 | 8/1985 |
| JP | 61-067269 | 4/1986 |
| JP | 61-088565 | 5/1986 |
| JP | 61-220371 | 9/1986 |
| JP | 62-005661 | 1/1987 |
| JP | 62-117359 | 5/1987 |
| JP | 64-019761 | 1/1989 |
| JP | 64-053459 | 3/1989 |
| JP | 64-053460 | 3/1989 |
| JP | 64-059866 | 3/1989 |
| JP | 02-015676 | 1/1990 |
| JP | 03-082171 | 4/1991 |
| JP | 03-256365 | 11/1991 |
| JP | 04-152574 | 5/1992 |
| JP | 04-364074 | 12/1992 |
| JP | 07-130652 | 5/1995 |
| JP | 02-666293 | 6/1997 |
| JP | 2666293 | 6/1997 |
| JP | 10-135468 | 5/1998 |
| JP | 10-135469 | 5/1998 |
| JP | 10-270363 | 10/1998 |
| JP | 10-374878 | * 12/1998 |
| JP | 11-354802 | 12/1999 |
| JP | 2000-183356 | 6/2000 |
| JP | 2000-194014 | 7/2000 |
| JP | 2000-196093 | 7/2000 |
| JP | 2000-1940214 | 7/2000 |
| WO | 93/21659 | 10/1993 |

OTHER PUBLICATIONS

Farrah et al., "Analysis of Double-Gate Thin-Film Transistor", pp. 69-74, Feb. 1967, IEEE Transactions on Electron Devices, vol. ED-14, No. 2.

Ishii et al., "A Trial Product of Dual-Gate MOS (X MOS) Device", pp. 405, 1985, 46th Japan Society of Applied Physics, 2a-V-9.

Ishii et al., "Experimental Fabrication of XMOS Transistors Using Lateral Solid-Phase Epitaxy of CVD Silicon Films", pp. L521-L523, Apr. 1990, Japanese Journal of Applied Physics, vol. 29, No. 4.

Noguchi et al., "Advanced High Mobility Polysilicon Super-thin Film Transistor (SFT) Using Solid Phase Growth", pp. 549-552, 1986, Extended Abstracts of the 18th International Conference on Solid State Devices and Materials, Tokyo, B-10-2.

Hayashi et al., "Polysilicon Super-Thin-Film Transistor (SFT)", pp. L819-L820, Nov. 1984, Japanese Journal of Applied Physics, vol. 23, No. 11.

Hayashi et al., "High Performance Superthin Film Transistor (SFT) with Twin Gates", pp. 59-62, 1987, Extended Abstracts of the 19th Conference on Solid State Devices and Materials, Tokyo, A-3-5.

Sekigawa et al., "The Development of XMOS Transistor", pp. 44-49, 1986, Semiconductor World.

Tuan et al., "Dual-Gate a-Si:H Thin Film Transistors", pp. 357-359, Dec. 1982, IEEE Electron Device Letters, vol. EDL-3, No. 12.

Specifications and Drawings for U.S. Appl. No. 09/837,552, "Semiconductor Device and Manufacturing Method Thereof", filed Apr. 19, 2001, Hishashi Ohtani et al.

Specifications and Drawings for U.S. Appl. No. 09/837,558, "Semiconductor Device and Manufacturing Method Thereof", filed Apr. 19, 2001, Shunpei Yamazaki et al.

Byeon et al.; "High-Performance Tantalum Oxide Capacitors Fabricated by a Novel Reoxidation Scheme"; IEEE Transactions on Electron Devices; vol. 37; No. 4; pp. 972-979.

* cited by examiner

Phosphorus (n-) Doping Step

Boron (P++) Doping Step

Back Side Exposure Step, Phosphorus (n+) Doping Step

Phosphorus (n-) Doping Step

Boron (p++) Doping Step

Back Side Exposure Step, Phosphorus (n+) Doping Step

Pixel TFT Portion    Storage Capacitor Portion 319 321a 321b 320    323    324

Gettering Step by Phosphorus

Phosphorus (n-) Doping Step

Back Side Exposure Step, Phosphorus (n+) Doping Step

Boron (p++) Doping Step

Pixel TFT Portion　　　　　　　　　　Storage Capacitor Portion

SEMICONDUCTOR DEVICE HAVING A PIXEL MATRIX CIRCUIT THAT INCLUDES A PIXEL TFT AND A STORAGE CAPACITOR

BACKGROUND OF THE INVENTION

1. Field of the Invention

The present invention relates to a semiconductor device having a circuit composed of a thin film transistor (hereinafter referred to as TFT). For example, the invention relates to an electro-optical device represented by a liquid crystal display panel and to electronic equipment mounted with the electro-optical device as a component.

In this specification, a 'semiconductor device' refers to a device in general that utilizes semiconductor characteristics to function, and electro-optical devices, semiconductor circuits, and electronic equipment are semiconductor devices.

2. Description of Related Art

A thin film transistor (hereinafter referred to as TFT) can be formed on a transparent glass substrate, and hence its application to an active matrix liquid crystal display (hereinafter referred to as AM-LCD) has been developed actively. A TFT utilizing a crystalline semiconductor film (typically, a polysilicon film) can provide high mobility, making it possible to integrate functional circuits on the same substrate for high definition image display.

An active matrix liquid crystal display device requires million TFTs for pixels alone when the screen is to have high definition. Its functional circuits also need TFTs to further increase the number of required TFTs. Each of these TFTs has to have secured reliability and operate stably in order to realize stable operation of the liquid crystal display device.

However, the TFT is considered as not so equal in terms of reliability to a MOSFET that is formed on a single crystal semiconductor substrate. The TFT experiences lowering of mobility and ON current when it is operated for a long period of time, as the MOSFET suffers from the same phenomena. One of causes of the phenomena is characteristic degradation due to hot carriers that accompany enlargement of a channel electric field.

The MOSFET, on the other hand, has the LDD (lightly doped drain) structure as a well-known reliability improving technique. This structure adds a low concentration impurity region inside a source/drain region. The low concentration impurity region is called an LDD region. Some TFTs employ the LDD structure.

Another known structure for the MOSFET is to make the LDD region somewhat overlap a gate electrode through a gate insulating film. This structure can be obtained in several different modes. For example, structures called GOLD (Gate-drain overlapped LDD) and LATID (Large-tilt-angle-implanted drain) are known. The hot carrier withstandingness can be enhanced by these structures.

There have been attempts to apply these structures for MOSFETs to TFTs. However, application of the GOLD structure (in this specification, a structure having an LDD region to which a gate voltage is applied is called a GOLD structure whereas a structure having merely an LDD region to which a gate voltage is not applied is called an LDD structure) to a TFT has a problem of OFF current (current flowing when the TFT is in an OFF state) being larger than in the LDD structure. For that reason, the GOLD structure is not suitable for a circuit in which OFF current should be as small as possible, such as a pixel matrix circuit of an AM-LCD.

SUMMARY OF THE INVENTION

An object of the present invention is to provide an AM-LCD having high reliability by constructing circuits of the AM-LCD from TFTs having different structures to suit the respective functions of the circuits. The invention aims to accordingly enhance the reliability of a semiconductor device (electronic equipment) having this AM-LCD.

Another object of the present invention is to provide a TFT structure for reducing OFF current as much as possible and a structure for improving a capacity of a storage capacitance (also called an auxiliary capacitor) for a pixel matrix circuit of an AM-LCD.

According to a structure of the present invention disclosed in this specification, a semiconductor device having a pixel matrix circuit that includes a pixel TFT and a storage capacitor is characterized in that:

the pixel TFT has a channel formation region formed above a first wiring line through an insulating layer, and has a low concentration impurity region that is in contact with the channel formation region and overlaps the first wiring line; and the storage capacitor is formed from a capacitor wiring line formed on the same layer as the first wiring line, from a semiconductor region that has the same composition as the channel formation region or the low concentration impurity region, and from a part of the insulating layer.

According to another structure of the present invention, a semiconductor device having a plurality of pixels which include a pixel TFT and a storage capacitor is characterized in that:

the pixel TFT has a channel formation region formed above a first wiring line through a first insulating layer and a second insulating layer, and has a low concentration impurity region that is in contact with the channel formation region and overlaps the first wiring line; and the storage capacitor is formed from a capacitor wiring line formed on the same layer as the first wiring line, from a semiconductor region that has the same composition as the channel formation region or the low concentration impurity region, and from the first insulating layer.

According to another structure of the present invention, a semiconductor device having a plurality of pixels which include a pixel TFT and a storage capacitor is characterized in that:

the pixel TFT has a channel formation region formed above a first wiring line through a first insulating layer, a second insulating layer, and a silicon oxide film, and has a low concentration impurity region that is in contact with the channel formation region and overlaps the first wiring line; and the storage capacitor is formed from a capacitor wiring line formed on the same layer as the first wiring line, from a semiconductor region that has the same composition as the channel formation region or the low concentration impurity region, and from a laminate of the first insulating layer and the silicon oxide film.

In the above structures, the first wiring line is appropriately a conductive film mainly containing an element selected from the group consisting of tantalum (Ta), chromium (Cr), titanium (Ti), tungsten (W), molybdenum (Mo), and silicon (Si), or an alloy film or silicide film containing the above elements in combination, or a laminate of the conductive films, the alloy films, or the silicide films.

The semiconductor device is also characterized in that the channel formation region of the pixel TFT and the semiconductor region of the storage capacitor are formed of the same semiconductor layer.

The first insulating layer that functions as dielectric of the storage capacitor is appropriately an oxide or halogenated compound containing an element selected from the group consisting of tantalum (Ta), titanium (Ti), barium (Ba), hafnium (Hf), bismuth (Bi), tungsten (W), thorium (Th), thallium (Tl), and lead (Pb).

These thin films have as high dielectric constant as 10 to 100, and are suitable for the dielectric of the storage capacitor. A ferroelectric film, such as PZT (lead zirconate titanate), BST (barium strontium titanate) and a Yl-based material (strontium bismuth tantalate niobate) may also be used.

It is effective to improve the aperture ratio by forming the storage capacitor from the high dielectric constant film under a source wiring line of the pixel matrix circuit, and/or under a gate wiring line thereof.

According to another structure of the present invention, a semiconductor device having a pixel matrix circuit and a driver circuit that are formed on the same substrate is characterized in that:

a pixel TFT included in the pixel matrix circuit and an n-channel TFT included in the driver circuit each have a channel formation region formed above a first wiring line through an insulating layer, and each have a low concentration impurity region that is in contact with the channel formation region and overlaps the first wiring line;

a storage capacitor included in the pixel matrix circuit is formed from a capacitor wiring line formed on the same layer as the first wiring line, from a semiconductor region that has the same composition as the channel formation region or the low concentration impurity region, and from a part of the insulating layer; and the first wiring line connected to the pixel TFT is kept at the lowest power supply electric potential, and the first wiring line connected to the n-channel TFT is kept at the same level of electric potential as a gate electrode of the n-channel TFT.

According to another structure of the present invention, a semiconductor device having a pixel matrix circuit and a driver circuit that are formed on the same substrate is characterized in that:

a pixel TFT included in the pixel matrix circuit and an n-channel TFT included in the driver circuit each have a channel formation region formed above a first wiring line through a first insulating layer and a second insulating layer, and each have a low concentration impurity region that is in contact with the channel formation region and overlaps the first wiring line;

a storage capacitor included in the pixel matrix circuit is formed from a capacitor wiring line formed on the same layer as the first wiring line, from a semiconductor region that has the same composition as the channel formation region or the low concentration impurity region, and from the first insulating layer; and the first wiring line connected to the pixel TFT is kept at the lowest power supply electric potential, and the first wiring line connected to the n-channel TFT is kept at the same level of electric potential as a gate electrode of the n-channel TFT.

According to another structure of the present invention, a semiconductor device having a pixel matrix circuit and a driver circuit that are formed on the same substrate is characterized in that:

a pixel TFT included in the pixel matrix circuit and an n-channel TFT included in the driver circuit each have a channel formation region formed above a first wiring line through a first insulating layer, a second insulating layer, and a silicon oxide film, and each have a low concentration impurity region that is in contact with the channel formation region and overlaps the first wiring line;

a storage capacitor included in the pixel matrix circuit is formed from a capacitor wiring line formed on the same layer as the first wiring line, from a semiconductor region that has the same composition as the channel formation region or the low concentration impurity region, and from a laminate of the first insulating layer and the silicon oxide film; and the first wiring line connected to the pixel TFT is kept at the lowest power supply electric potential, and the first wiring line connected to the n-channel TFT is kept at the same level of electric potential as a gate electrode of the n-channel TFT.

DETAILED DESCRIPTION OF THE INVENTION

An embodiment mode of the present invention will be described taking as an example a CMOS circuit (inverter circuit) in which an n-channel TFT (hereinafter referred to as NTT) is combined with a p-channel TFT (hereinafter referred to as PTFT).

Figure 1A:
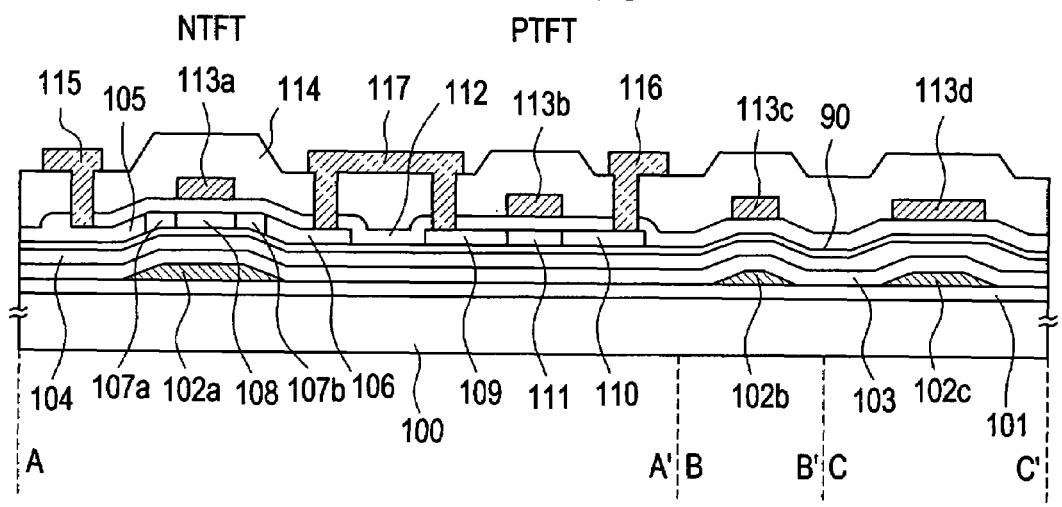
FIGS. 1A–B shows a structure of a CMOS circuit
Figure 1B:
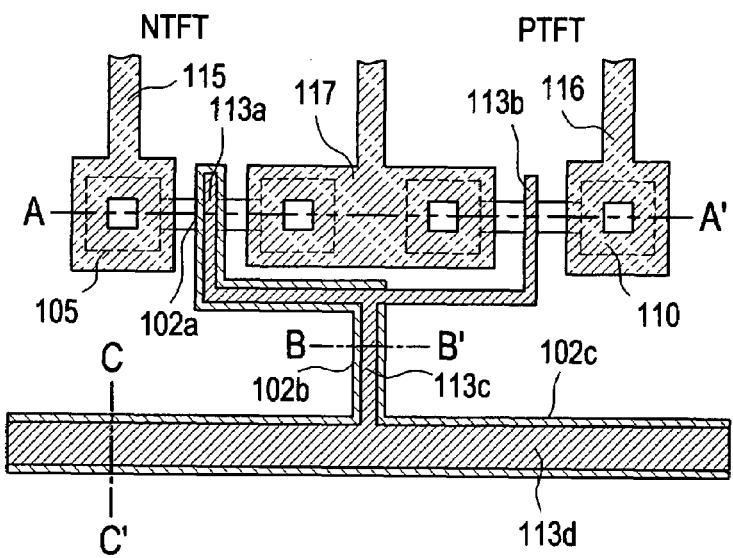

A sectional structure thereof is shown in FIG. 1A and a top view thereof is shown in FIG. 1B. The description will be given using symbols common to FIG. 1A and FIG. 1B. The sectional views taken along the lines A–A', B–B', and C–C' in FIG. 1B correspond to the sectional views A–A', B–B', and C–C' in FIG. 1A, respectively.

In FIG. 1A, 100 denotes a substrate; 101, a base film; 102a, 102b, and 102c, first wiring lines; 103, a first insulating layer; 104, a second insulating layer; and 90, a silicon oxide film to serve as a base of active layers. An active layer of the NTFT is composed of a source region 105, a drain region 106, low concentration impurity regions (LDD regions) 107a and 107b, and a channel formation region 108. An active layer of the PTFT is composed of a drain region 109, a source region 110, and a channel formation region 111.

112 is a second insulating layer on which second wiring lines 113a, 113b, 113c, and 113d are formed from a conductive film. 114 denotes a first interlayer insulating layer; 115 to 117, third wiring lines; 115 and 116, source wiring lines; and 117, a drain wiring line (including a drain electrode).

In the CMOS circuit structured as above, a glass substrate, a quartz substrate, a metal substrate, a stainless steel substrate, a plastic substrate, a ceramic substrate, or a silicon substrate may be used as the substrate 100. When a silicon substrate is used, it is appropriate to oxidize its surface to form a silicon oxide film in advance.

The base film 101 may be an insulating film mainly containing silicon, such as a silicon oxide film, a silicon nitride film, and a silicon oxynitride film. It is also preferable to use a dense, hard insulating film such as a tantalum oxide film.

Although the first wiring line is a wiring line of the same pattern as shown in FIG. 1B, it is sectioned into 102a, 102b, and 102c for the sake of explanation. Here, the first wiring line 102a represents an intersection with the active layer, the first wiring line 102b represents a connection between the TFTs, and the first wiring line 102c represents a power supplying portion common to the circuits.

The first wiring line 102a here functions as a subordinate gate electrode of the NTFT. That is, the electric charge of the channel formation region 108 is controlled by the first wiring line 102a and by the second wiring line (main gate electrode) 113a that is given with the same level of electric potential as the first wiring line 102a (or a predetermined electric potential), so that only the first wiring line 102a can apply a gate voltage (or a predetermined voltage) to the LDD regions 107a and 107b.

Accordingly, the GOLD structure cannot be obtained with the second wiring line 113a alone functioning as the gate electrode (the LDD structure is obtained instead), not until the first wiring line 102a joins with the second wiring line 113a. Advantages of this structure will be described later. The first wiring line 102a also functions as a light-shielding layer.

Any material can be used for the first wiring line as long as it has conductivity. However, a desirable material would be one having heat resistance against the temperature in a later process. For example, a conductive film mainly containing (50% or more composition ratio) an element selected from the group consisting of tantalum (Ta), chromium (Cr), titanium (Ti), tungsten (W), molybdenum (Mo), and silicon (Si), or an alloy film or silicide film containing the above elements in combination, or a laminate of the conductive films, the alloy films or the silicide films.

Specifically, a tantalum film, a chromium film, or a laminate of a tungsten silicide film and a silicon film is preferred. When a laminate of a tungsten silicide film and a silicon film is used, it is preferable to place the laminate such that the silicon film is closer to the active layer.

Given as a feature of this embodiment mode is providing the first wiring line 102a in the NTFT only and not in the PTFT. Although the PTFT in FIG. 1A does not have an offset region and an LDD region either, one of the regions or both of the regions may be formed in the PTFT.

Structured as above, the first wiring line is led from the power supplying portion through the connection to the NTFT to function as a subordinate gate electrode of the NTFT as shown in FIG. 1B.

The second wiring line is also a wiring line of the same pattern but, for the sake of explanation, is sectioned almost the same way the first wiring line is sectioned. In FIG. 1A, 113a represents an intersection with the active layer of the NTFT, 113b represents an intersection with the active layer of the PTFT, 113c represents a connection between the TFTs, and 114d represents a power supplying portion.

Any film can be used for the second wiring lines as long as it is a conductive film. A tantalum (Ta) film, a chromium (Cr) film, a titanium (Ti) film, a tungsten (W) film, a molybdenum (Mo) film, and a silicon (Si) film may be used in any combination to form the second wiring lines. An alloy film or silicide film of those may also be used. Alternatively, same kind of conductive films or different kinds of conductive films may be layered to form the second wiring lines.

As described above, the CMOS circuit of this embodiment mode has the first wiring line (subordinate gate wiring line) in the NTFT and the same level of voltage as the second wiring line (main gate wiring line) or a predetermined voltage is applied to the first wiring line, thereby giving the NTFT the GOLD structure.

An embodiment mode of the present invention will be described taking as an example a pixel matrix circuit that uses an NTFT for a pixel TFT. This pixel matrix circuit is formed on the same substrate as the CMOS circuit described in Embodiment Mode 1 at the same time. Therefore, see the description in Embodiment Mode 1 for details of the wiring lines denoted by the identical names.

Figure 2A:
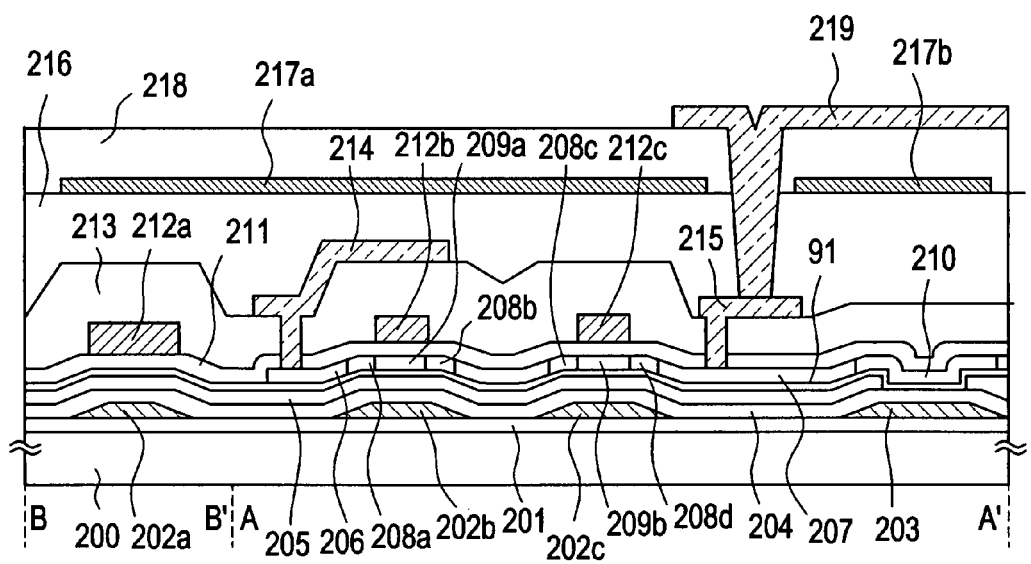
FIGS. 2A–B shows a structure of a pixel matrix circuit
FIGS. 3A–E] shows a process of manufacturing a CMOS circuit.
Figure 2B:
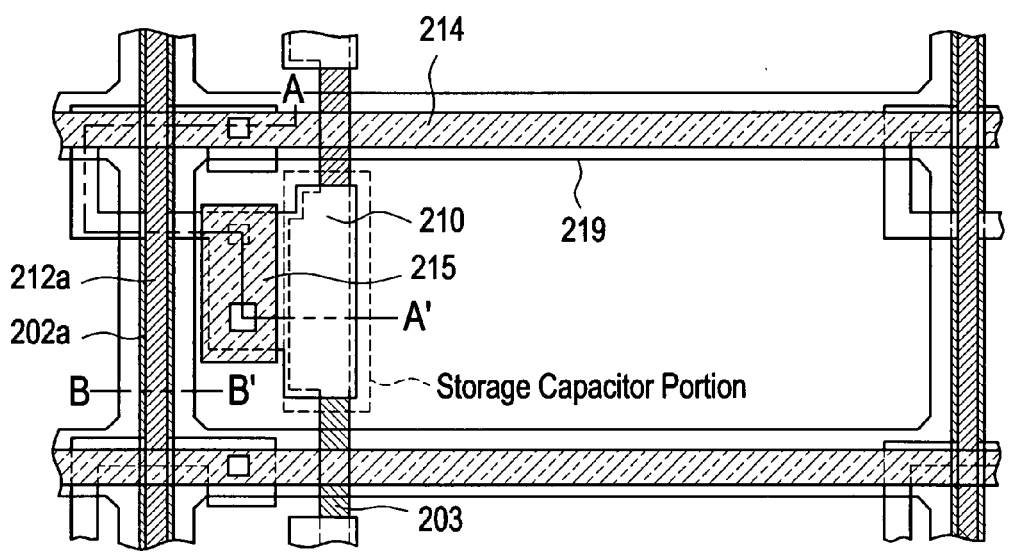

A sectional structure of the pixel matrix circuit is shown in FIG. 2A and a top view thereof is shown in FIG. 2B. The description will be given using symbols common to FIG. 2A and FIG. 2B. The sectional views taken along the lines A–A' and B–B' in FIG. 2B correspond to the sectional views A–A' and B–B' in FIG. 2A, respectively.

In FIG. 2A, 200 denotes a substrate, 201, a base film, 202a to 202c, first wiring lines, 203, a capacitor wiring line, 204, a first insulating layer, 205, a second insulating layer, and 91, a silicon oxide film to serve as a base of an active layer. An active layer of the pixel TFT (NTFT) is composed of a source region 206, a drain region 207, low concentration impurity regions (LDD regions) 208a to 208d, and channel formation regions 209a and 209b.

The pixel TFT shown here as an example has a double gate structure, but it may have a single gate structure or a multi-gate structure in which three or more TFTs are connected in series. Needless to say, the source region and the drain region switch depending on whether the pixel TFT charges or discharges.

Here, a storage capacitor is formed between the capacitor wiring line 203 and a semiconductor region 210 (namely, a portion extended from the drain region 207) with the first insulating layer 204 and the silicon oxide film 91 as dielectric. Usable as the first insulating layer 204 in this case is an oxide or halogenated compound containing an element selected from the group consisting of tantalum (Ta), titanium (Ti), barium (Ba), hafnium (Hf), bismuth (Bi), tungsten (W), thorium (Th), thallium (Tl), and lead (Pb).

These oxides are known to have high dielectric constant and exhibit a dielectric constant of about 10 to 100. One of the features of this embodiment is that such a high dielectric constant film is used as the dielectric of the storage capacitor. For example, a tantalum oxide film is preferable, for it has a dielectric constant of 25 and is easy to form by sputtering.

The silicon oxide film 91 that is a part of the dielectric is provided as a barrier layer for preventing reaction in the interface between the first insulating layer 204 and the semiconductor region 210. The silicon oxide film 91 and a semiconductor layer that is to serve as the active layer are preferably formed in succession without being exposes to the air. This prevents contamination by elements in the air, such as boron, landing on the bottom surface of the active layer.

Second wiring lines 212a, 212b, and 212c are formed on the second insulating layer 211. The second wiring line 212a is a so-called gate wiring line, whereas 212b and 212c are substantial gate electrodes.

Denoted by 213 is a first interlayer insulating layer, 214 and 215, third wiring lines, 214, a source wiring line (including a source electrode), and 215, a drain wiring line (including a drain electrode). Formed thereon are a second interlayer insulating layer 216, black masks 217a and 217b, a third interlayer insulating layer 218, and a pixel electrode 219.

Although the first wiring line is a wiring line of the same pattern as shown in FIG. 2B, it is sectioned into 202a, 202b, and 202c for the sake of explanation. Here, the first wiring line 202a represents a wiring line portion that does not function as a gate electrode, whereas 202b and 202c are intersections with the active layer and function as the gate electrodes.

The first wiring lines shown here are formed at the same time the first wiring lines described in Embodiment Mode 1 are formed. Therefore the material and other explanations thereof are omitted.

The first wiring lines 202b and 202c function as light-shielding films of the pixel TFT. In other words, they do not have the function of the subordinate gate wiring line as the one described in Embodiment Mode 1, and are given a fixed electric potential or set to a floating state (an electrically isolated state). That is, the first wiring lines 202b and 202c in the pixel TFT have to have such an electric potential as to make them function merely as light-shielding layers without influencing the operation of the TFT.

The fixed electric potential is at least lower than the lowest electric potential of a video signal (specifically −8 V, if the amplitude of the video signal is −8 to 8 V), preferably lower than the lowest power supply electric potential of the entire circuit to be formed or the same as the lowest power supply electric potential.

In the case of an AM-LCD, for example, power supply lines formed in a driver circuit and other signal processing circuits are different from ones formed in a pixel matrix circuit, and these different power supply lines are given with their respective predetermined electric potentials. That is, various levels of voltages are generated with a certain lowest electric potential as the reference. The lowest power supply electric potential refers to the lowest electric potential that is the reference for all those circuits.

By keeping the first wiring lines at the electric potential described above, holes generated by hot carrier injection can be removed from the channel formation regions and the punch through phenomenon brought by accumulated holes can be prevented.

Electric charges in the channel formation regions 209a and 209b are thus controlled by the first wiring lines 212b and 212c to provide the LDD structure. Therefore an increase in OFF current can be contained effectively.

In the pixel TFT, a laminate consisting of the first insulating layer 204, the second insulating layer 205, and the silicon oxide film 91 is interposed between the first wiring lines 202b and 202c and the channel formation regions 212b and 212c. Structurally, a parasitic capacitance is formed here but the operation of the TFT is not influenced when this parasitic capacitance (the sum of parasitic capacitance formed under the gate electrodes if the TFT have a multi-gate structure) is one third the storage capacitor or less (preferably one tenth or less).

The pixel matrix circuit shown in this embodiment mode thus has an NTFT as its pixel TFT, and the structure of the NTFT is the same as the NTFT of the CMOS circuit explained in Embodiment Mode 1 (the difference between the single gate structure and the double gate structure is ignored). However, the NTFT in the pixel matrix circuit is different from the NTFT in the CMOS circuit where the GOLD structure is obtained by using the first wiring line as a subordinate gate wiring line through application of a predetermined voltage, in that the LDD structure is obtained by giving the first wiring lines a fixed electric potential or setting them to a floating state.

In other words, the biggest feature of the present invention is that NTFTs having the same structure are formed on the same substrate and then they are respectively given the GOLD structure or the LDD structure by being applied or not being applied a voltage to their first wiring lines (subordinate gate wiring lines). This makes the optimal circuit design possible without increasing the number of manufacture steps.

The structures of the present invention in the above will be described in detail in the following embodiments.

Embodiment 1

In this embodiment, a method of manufacturing the CMOS circuit described in Embodiment Mode 1 will be described. The description will be given with reference to FIG. 3.

First, a glass substrate is prepared as a substrate 300. A silicon oxide film with a thickness of 200 nm is formed thereon by sputtering as a base film 301. On the base film, first wiring lines 302a, 302b, and 302c are formed. The material of the first wiring lines is a tantalum film formed by sputtering. An oxide film may be formed on a surface of the tantalum film.

Other metal films, alloy films, or a laminate of those may of course be used because the first wiring lines 302a, 302b, and 302c can be formed of any film as long as it has conductivity. A film that can be formed by patterning with a small taper angle is effective in improving the levelness.

Next, a tantalum oxide film is formed again by sputtering. In this embodiment, the thickness thereof is set to 10 to 500 nm (desirably 50 to 300 nm, more desirably 100 to 200 μm). A tantalum oxide film 303 formed here is used as dielectric of a storage capacitor in a pixel matrix circuit.

Other than the tantalum oxide film, an oxide containing an element selected from the group consisting of barium (Ba), hafnium (HF), bismuth (Bi), tungsten (W), thorium (Th), thallium (Tl), and lead (Pb) may be used. Basically, any material can be used as long as it is a thin film having a dielectric constant of 10 or higher (preferably 20 or higher).

A second insulating layer 304 is formed next from an insulating film containing silicon. This embodiment employs a layered structure in which a silicon nitride film with a thickness of 50 nm is formed first and a silicon oxide film with a thickness of 80 nm is formed thereon. The second insulating layer may of course be a single layer of silicon oxide film, or a silicon oxynitride film expressed as SiOxNy (x/y=0.01 to 100).

When the silicon oxynitride film is used, the withstand voltage thereof can be enhanced by making the nitrogen content larger than the oxygen content. Doping a silicon nitride film with boron is effective, for its heat conductivity is enhanced to improve the heat releasing effect.

Next, a silicon oxide film 92 with a thickness of 10 nm is formed and an amorphous silicon film (not shown in the drawing) with a thickness of 50 nm is formed thereon successively without being exposed to the air. The applicant of the present invention has found that boron landed from the air on the bottom surface of an active layer affects TFT characteristics (especially the threshold voltage). However, this problem can be solved by forming a thin silicon oxide film and an amorphous silicon film in succession as in this embodiment. This silicon oxide film also functions as a barrier layer for preventing the tantalum oxide film to serve as the dielectric of the storage capacitor in the pixel matrix circuit from reacting with the active layer.

The amorphous silicon film is then crystallized using the technique disclosed in Japanese Patent Application Laid-open No. Hei 7-130652 (corresponding to U.S. patent application Ser. No. 08/329,644 or U.S. patent application Ser. No. 08/430,623) to obtain a crystalline silicon film (not shown). The technique described in the publication is a thermal crystallization method with the use of a catalytic element. In this embodiment, nickel is used as the catalytic element.

Nickel is no longer necessary after crystallization and is removed from the crystalline silicon film using, in this embodiment, the technique disclosed in Japanese Patent Application Laid-open No. Hei 10270363 (corresponding to U.S. patent application Ser. No. 09/050,182).

The technique described in Japanese Patent Application Laid-open No. Hei 10-270363 is to remove a catalytic element used in crystallization by utilizing the gettering effect of phosphorus after crystallization. With this technique, the concentration of the catalytic element in the crystalline semiconductor film can be reduced to $1\times10^{17}$ atoms/cm$^3$ or less, preferably to $1\times10^{16}$ atoms/cm$^3$.

Next, the resultant crystalline silicon film is patterned to form active layers 305 and 306. Although this embodiment uses as a semiconductor film for the active layers a crystalline silicon film obtained by crystallizing an amorphous silicon film, other semiconductor films such as a microcrystalline silicon film may be used or a crystalline silicon film may be formed directly. Other than silicon films, a compound semiconductor film such as a silicon germanium film may be used.

The crystalline silicon film may be doped with an element belonging to Group 13 and/or an element belonging to Group 15 before or after the active layers 305 and 306 are formed. The element or elements used for the doping here is/are for controlling threshold voltage of the TFTs.

For example, the entire crystalline silicon film is doped first with boron as the element belonging to Group 13 to control the threshold in the plus direction, and then selectively doped with phosphorus to control the threshold in the minus direction, whereby threshold voltages of the NTFT and the PTFT are adjusted to desired values.

A third insulating layer 307 is formed next from a silicon oxide film, a silicon oxynitride film, or a silicon nitride film, or a laminate of those so as to cover the active layers 305 and 306. A silicon oxynitride film is formed here by plasma CVD to a thickness of 100 nm. The third insulating layer functions as a gate insulating film when a second wiring line is used as a main gate wiring line.

A tantalum film 308 to serve later as the second wiring line is formed to have a thickness of 200 nm. Either sputtering or CVD can be used to form the tantalum film 308.

Figure 3A:
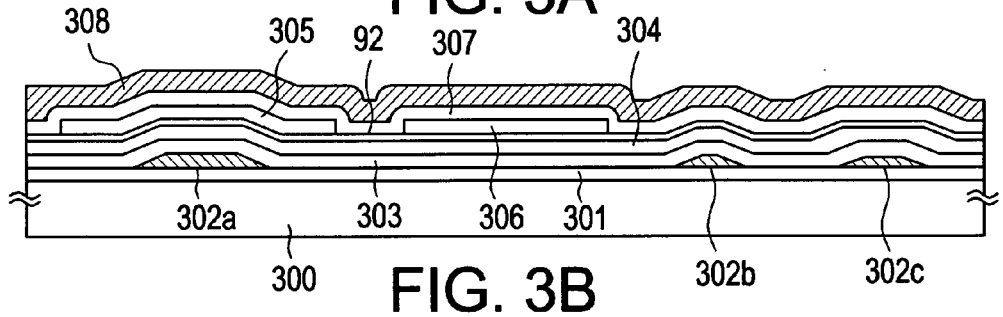

After the state of FIG. 3A is thus obtained, resist masks 309a and 309b are formed to etch the tantalum film 308. In this way, a second wiring line 310a is formed from the tantalum film. The second wiring line 310a corresponds to the second wiring line (main gate wiring line) 113a in FIG. 1A. A tantalum film 310b is left so as to hide regions other than the region to become the NTFT.

Figure 3B:
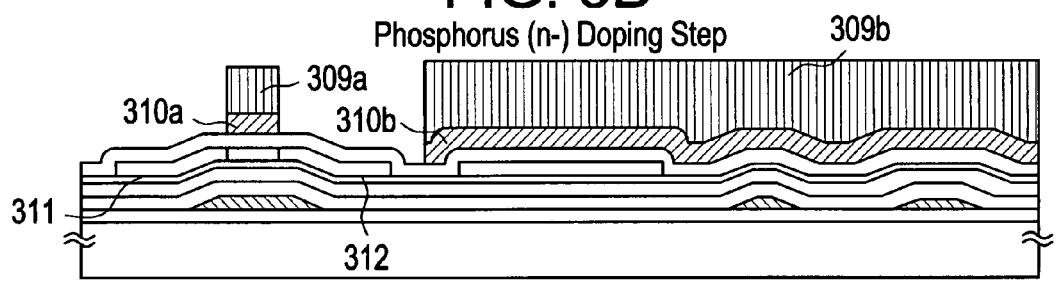

Next, the film is doped with an element belonging to Group 15 (typically, phosphorus or arsenic) to form low concentration impurity regions 311 and 312. In this embodiment, phosphorus is used as the element belonging to Group 15, and ion doping that does not involve mass separation is employed. Doping conditions include setting the acceleration voltage to 90 keV, and adjusting the dose so that phosphorus is contained in a concentration of $1\times10^6$ to $1\times10^{19}$ atoms/cm$^3$ (preferably $5\times10^{17}$ to $5\times10^{18}$ atoms/cm$^3$). This concentration later sets the impurity concentration in the LDD regions, and hence is needed to be controlled precisely. (FIG. 3B)

In this specification, the impurity doping step conducted under those conditions is called a phosphorus (n−) doping step.

The resist masks 309a and 309b are then removed and resist masks 313a to 313d are newly formed. The tantalum film 310b is etched to form second wiring lines 314a to 314c. The second wiring lines 314a, 314b, and 314c respectively correspond to the second wiring lines 113b, 113c, and 113d of FIG. 1A.

Figure 3C:
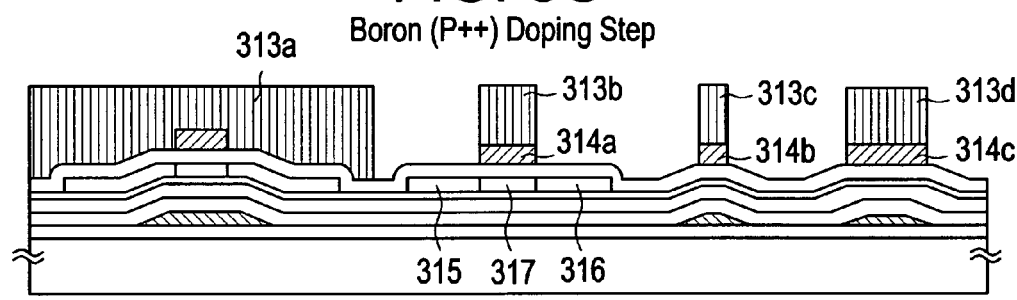

Next, the film is doped with an element belonging to Group 13 (typically boron or gallium) to form a drain region 315 and a source region 316. A channel formation region 317 of the PTFT is defined simultaneously. In this embodiment, boron is used as the element belonging to Group 13, and ion doping that does not involve mass separation is employed. Doping conditions include setting the acceleration voltage to 75 keV, and adjusting the dose so that boron is contained in a concentration of $1\times10^{19}$ to $5\times10^{21}$ atoms/cm$^3$ (preferably $1\times10^{20}$ to $1\times10^{21}$ atoms/cm$^3$). (FIG. 3C)

In this specification, the impurity doping step conducted under those conditions is called a boron (p++) doping step.

The resist masks 313a to 313d are then removed and resist masks 318a to 318d are formed again. In this embodiment, the resist masks are formed by a back side exposure method. For the resist masks 318a, 318c, and 318d, the first wiring lines serve as masks whereas the second wiring lines serve as masks for the resist mask 318b. With the first wiring lines as masks, a small amount of light reaches behind the wiring lines and hence the line width in this case is narrower than the width of the first wiring lines. The line width can be controlled by exposure conditions. That is, the width (length) of the LDD regions can be controlled by controlling the amount of light that reaches behind the wiring lines.

The resist masks can of course be formed by using masks instead. In this case, the degree of freedom in pattern design is raised but the number of masks is increased.

After the resist masks 318a to 318d are thus formed, a step of doping with an element belonging to Group 15 (phosphorus in this embodiment) is conducted. Here, the acceleration voltage is set to 90 keV, and the dose is adjusted so that phosphorus is contained in a concentration of $1\times10^{19}$ to $5\times10^{21}$ atoms/cm$^3$ (preferably $1\times10^{20}$ to $1\times10^{21}$ atoms/cm$^3$).

In this specification, the impurity doping step conducted under those conditions is called a phosphorus (n+) doping step.

Through this step, a source region 319, a drain region 320, an LDD regions 321a and 321b, and a channel formation region 322 of the NTFT are defined. A drain region 323 and a source region 324 of the PTFT are also doped with phosphorus in this step. However, the P type conductivity thereof can be maintained and is not reversed to the N type conductivity if they are doped with boron in a higher concentration in the previous step.

After the NTFT and the PTFT are thus doped with impurity elements each imparting one of the conductivity types, the impurity elements are activated by furnace annealing, laser annealing, or lamp annealing, or by using these annealing methods in combination.

Figure 3D:
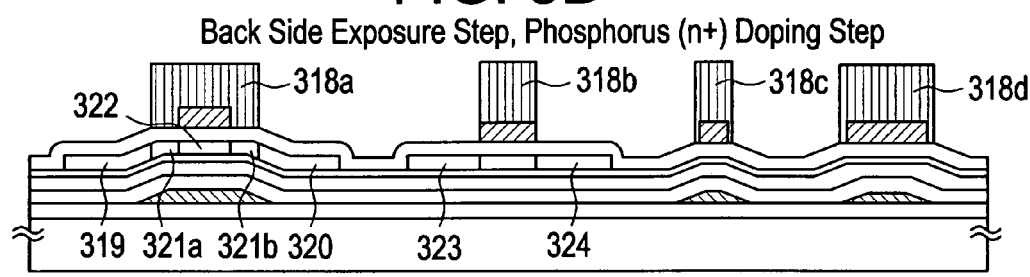

The state of FIG. 3D is obtained in this way. Then a first interlayer insulating layer 325 is formed from a silicon oxide film, a silicon nitride film, a silicon oxynitride film, or a resin film, or from a laminate of those films. Contact holes are opened in the layer to form source wiring lines 326 and 327 and a drain wiring line 328. (FIG. 3E).

The first interlayer insulating layer 325 in this embodiment has a two-layer structure in which a silicon nitride film with a thickness of 50 nm is formed first and a silicon oxide film with a thickness of 950 nm is formed thereon. The source wiring lines 326 and 327 and the drain wiring line 328 in this embodiment are formed by patterning a three-layer structure laminate obtained by successively forming, by sputtering, a titanium film with a thickness of 100 nm, an aluminum film containing titanium and having a thickness of 300 nm, and another titanium film with a thickness of 150 nm.

Figure 3E:
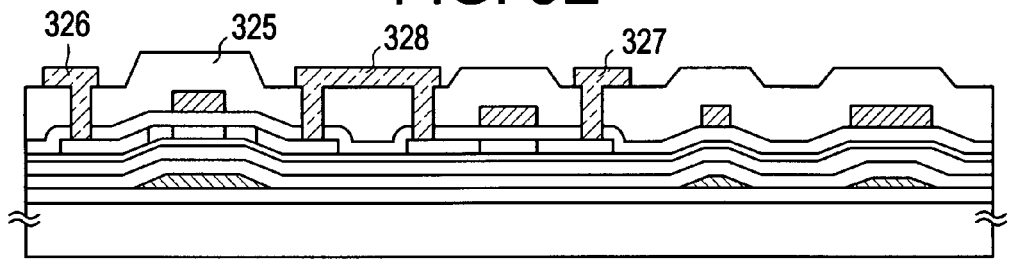

A CMOS circuit structured as shown in FIG. 3E is thus completed. The CMOS circuit of this embodiment has the structure shown in FIG. 1A, and explanations thereof are omitted here because it is described in detail in Embodiment Mode 1. To obtain the structure of FIG. 1A, the manufacturing process is not necessarily limited to the process of this embodiment. For example, the NTFT may take the double gate structure while the PTFT is given the single gate structure.

The CMOS circuit described in this embodiment serves as a basic unit circuit for constructing a driver (driving) circuit (including a shift register circuit, a buffer circuit, a level shifter circuit, a sampling circuit, etc.) and other signal processing circuits (such as a dividing circuit, a D/A converter circuit, a γ correction circuit, and an operation amplifier circuit) in an AM-LCD.

In this embodiment, the first wiring line of the NTFT is used as a subordinate gate wiring line to thereby obtain a substantial GOLD structure and prevent degradation by hot carrier injection. Accordingly, a circuit having a very high reliability can be formed.

Embodiment 2

In this embodiment, a method of manufacturing the pixel matrix circuit described in Embodiment Mode 2 will be described. The description will be given with reference to FIGS. 4 and 5. The pixel matrix circuit is formed on the same substrate as the CMOS circuit shown in Embodiment 1 at the same time. Therefore, the description will be given in relation to the manufacturing process of Embodiment 1 and the symbols identical with those in FIG. 3 are used when necessary.

First, the base film 301 is formed on the glass substrate 300 from a tantalum oxide film. On the base film, first wiring lines 401a, 401b, and 401c and a capacitor wiring line 402 are formed. The first wiring line 401a corresponds to the first wiring line 202a in FIG. 2A, the first wiring line 401b corresponds to the first wiring line 202b in FIG. 2A, and the first wiring line 401c corresponds to the first wiring line 202c in FIG. 2A.

The capacitor wiring line 402 corresponds to the capacitor wiring line 203 in FIG. 2A. The materials of the second wiring lines and the capacitor wiring line are as described in Embodiment 1.

Next, a first insulating layer 303 and a second insulating layer 304 are formed consulting Embodiment 1. After the second insulating layer 304 is formed, the second insulating layer 304 on the capacitor wiring line 402 that constitutes a storage capacitor is selectively etched to expose the first insulating layer 303. The exposed portion of the first insulating layer later functions as dielectric of the storage capacitor.

Upon completion of etching of the second insulating layer 304, the silicon oxide film 92 and the amorphous silicon film (not shown in the drawings) are formed successively without being exposed to the air. Through the crystallization step and the gettering step shown in Embodiment 1, an active layer 403 of the pixel TFT is formed.

At this point, the active layer forms the pixel TFT in a portion where it overlaps the first wiring lines 401b and 401c, and forms the storage capacitor in a portion where it overlaps the capacitor wiring line 402. That is, the pixel TFT is connected to the storage capacitor also in a physical sense through the active layer.

After the active layer 403 is formed, the second insulating layer 307 and the tantalum film 308 are formed. Thus obtained is the state of FIG. 4A. The CMOS circuit being formed simultaneously is now in the state of FIG. 3A.

Next, resist masks 404a to 404c are formed to etch the tantalum film 308. Second wiring lines 405a to 405c are thus formed. The second wiring line 405a corresponds to the second wiring line 212a in FIG. 2A, the second wiring line 405b corresponds to the second wiring line 212b in FIG. 2A, and the second wiring line 405c corresponds to the second wiring line 212c in FIG. 2A.

The phosphorus (n−) doping step for forming LDD regions later is conducted next to form low concentration impurity regions 406 to 408. This step corresponds to the step of FIG. 3B. Accordingly, the material and the thickness of the second wiring lines and phosphorus doping conditions in the step of FIG. 4B are the same as Embodiment 1.

A step corresponding to the step of FIG. 3C is conducted next. In this step, the entire surface of the pixel matrix circuit is covered with a resist mask 409 so as to avoid boron doping at all. (FIG. 4C)

The resist mask 409 is then removed. After that, resist masks 410a to 410d are formed by the back side exposure method. Then the phosphorus (n+) doping step is conducted to form a source region 411, a drain region 412, LDD regions 413a to 413d, and channel formation regions 414a and 414b. The back side exposure conditions and the phosphorus doping conditions are set in accordance with the step of FIG. 3D in Embodiment 1.

Figure 4A:
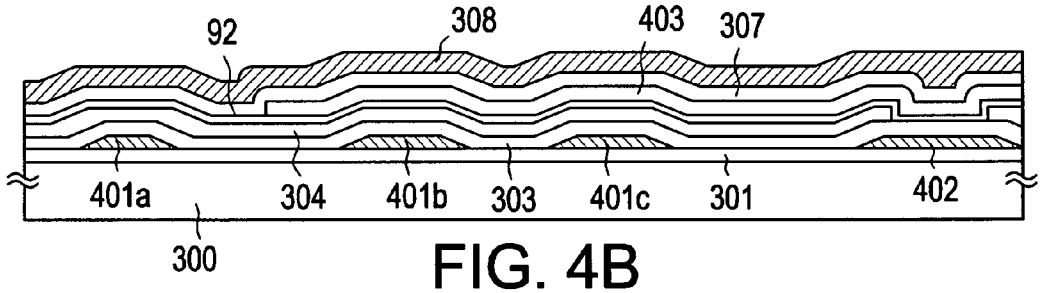
FIGS. 4A–E shows a process of manufacturing a pixel matrix circuit.
Figure 4B:
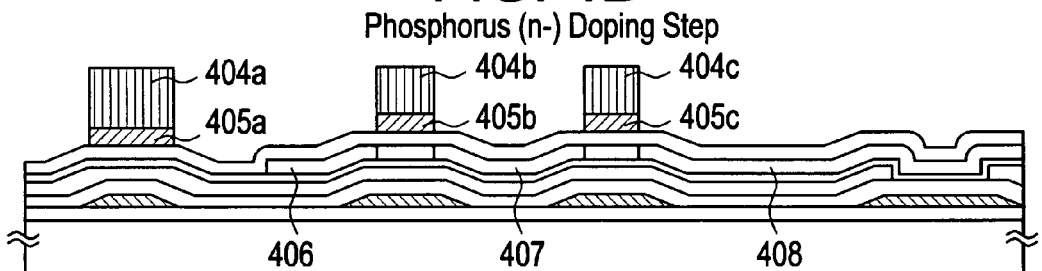
Figure 4C:
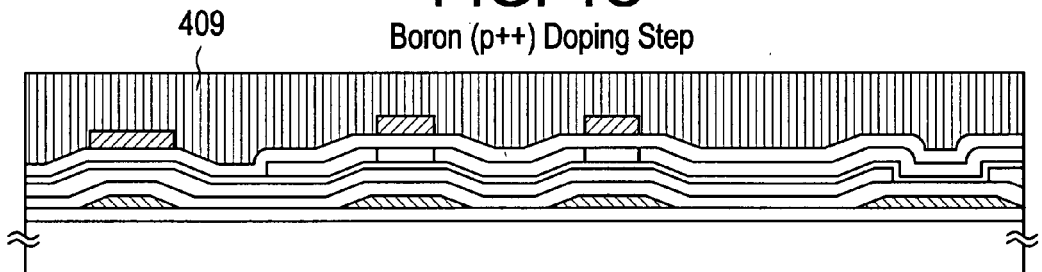
Figure 4D:
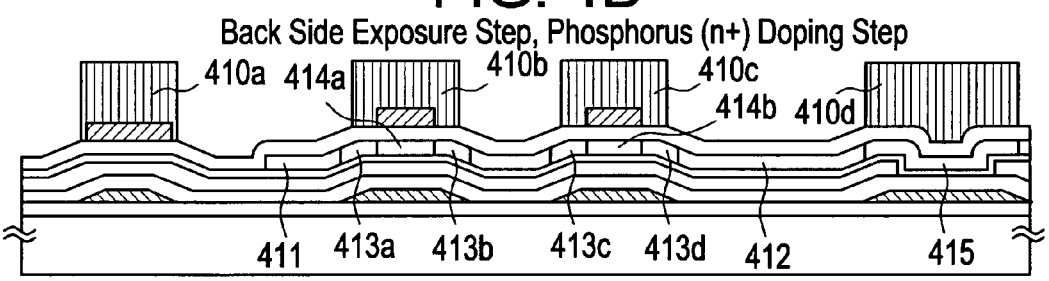

The source region and the drain region in FIG. 4D are named so for the sake of explanation. However, a source region and a drain region in a pixel TFT are reversed when the pixel switches between charging and discharging and hence there is no definite discrimination between the two regions.

A region denoted by 415 (a semiconductor region functioning as an electrode of the storage capacitor) is hidden by the resist mask 410d and, as a result, the region is doped with phosphorus in the same concentration as the LDD regions 413a to 413b (to have the same composition). This region can function as an electrode by applying a voltage to the first wiring lines 402. The first wiring lines 402, the first insulating layer 303, and the semiconductor region 415 form the storage capacitor.

If a resist mask is formed on the capacitor wiring line 402 in the step of FIG. 4B, the semiconductor region 415 can be an intrinsic or substantially intrinsic semiconductor region having the same composition as the channel formation regions 414a and 414b.

Thus, it is also a feature of this embodiment that the channel formation regions or the low concentration impurity regions (LDD regions) are formed of the same semiconductor layer as the semiconductor region that functions as an electrode of the storage capacitor.

Figure 4E:
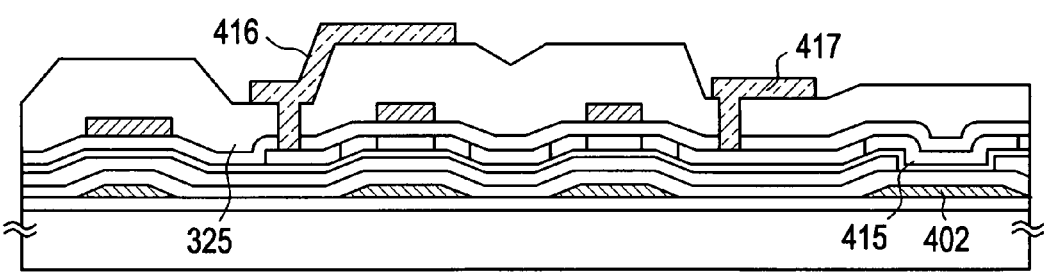

After the doping steps of phosphorus and boron are finished, the impurity elements are activated as in Embodiment 1. Then the first interlayer insulating film 325 is formed and contact holes are opened therein to form a source wiring line 416 and a drain wiring line 417. The state of FIG. 4E is thus obtained. The CMOS circuit at this point is in the state of FIG. 3E.

Next, a second interlayer insulating layer 418 is formed to cover the source wiring line 416 and the drain wiring line 417. In this embodiment, as a passivation film, a silicon nitride film with a thickness of 30 nm is formed and an acrylic film with a thickness of 700 nm is formed thereon. Of course, an insulating film mainly containing silicon such as a silicon oxide film, or other resin films may be used. Other resin films that are usable are a polyimide film, a polyamide film, a BCB (benzocyclobutene) film, and the like.

Next, black masks 420a and 420b are formed from a titanium film having a thickness of 100 nm. Other films may be used to form the black masks 420a and 420b if they have light-shielding property. Typically, a chromium film, an aluminum film, a tantalum film, a tungsten film, a molybdenum film, a titanium film, or a laminate of these films is used.

A third interlayer insulating layer 421 is then formed. Though an acrylic film with a thickness of 1 μm is used in this embodiment, the same material as the second interlayer insulating layer may be used instead.

A contact hole is next formed in the third interlayer insulating layer 421 to form a pixel electrode 422 from a transparent conductive film (typically an ITO film). The pixel electrode 422 is electrically connected to the drain wiring line 417. The contact hole accordingly has to be very deep, and hence it is effective in preventing failure such as break of the pixel electrode to form the contact hole such that its inner wall is tapered or curved.

The pixel electrode 422 in this embodiment is electrically connected to the pixel TFT through the drain wiring line 417. However, the pixel electrode 422 may be connected directly to the drain region 412 of the pixel TFT.

Figure 5A:
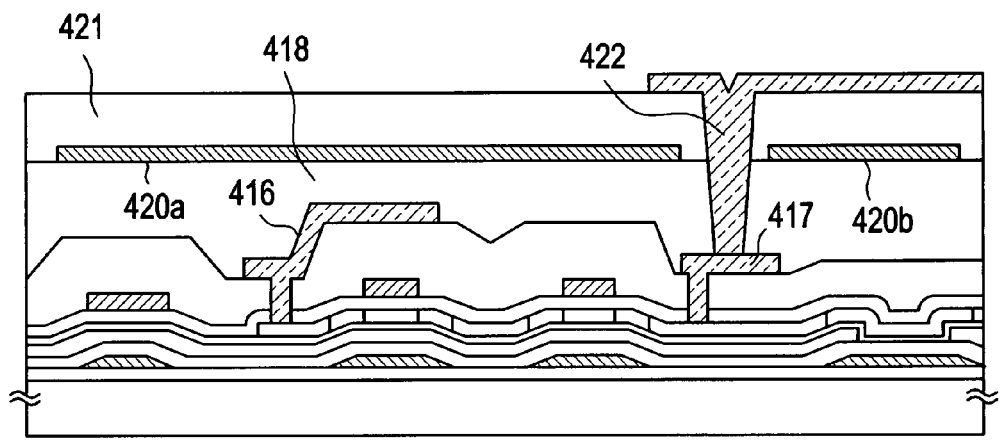
FIGS. 5A–B shows a process of manufacturing a pixel matrix circuit.

A pixel matrix circuit structured as shown in FIG. 5A is thus completed. Although the example shown in this embodiment is of manufacturing a transmissive AM-LCD using a transparent conductive film for a pixel electrode, a reflective AM-LCD can readily be manufactured if a metal film having high-reflectance (such as a metal film mainly containing aluminum) is used for the pixel electrode.

The substrate that has reached the state of FIG. 5A is called an active matrix substrate. This embodiment also describes a case of actually manufacturing an AM-LCD.

After the state of FIG. 5A is obtained, an alignment film 423 with a thickness of 80 nm is formed on the pixel electrode 422. An opposite substrate is fabricated next. The opposite substrate prepared is composed of a glass substrate 424 on which a color filter 425, a transparent electrode (opposite electrode) 426, and an alignment film 427 are formed. The alignment films 423 and 427 are subjected to rubbing treatment, and the active matrix substrate is bonded to the opposite substrate using a seal (sealing member). Then a liquid crystal 428 is held between the substrates.

A spacer for maintaining the cell gap may be provided if necessary. When the cell gap can be maintained without a spacer as in an AM-LCD having a diagonal size of 1 inch or less, there is no particular need to place a spacer.

Figure 5B:
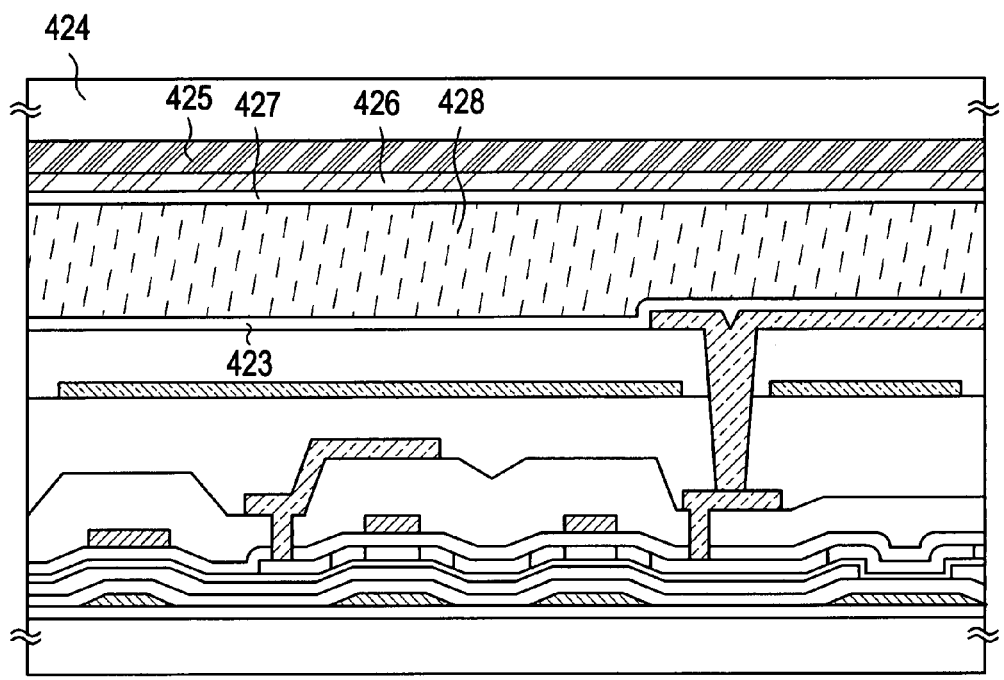

An AM-LCD structured as shown in FIG. 5B (the part corresponding to a pixel matrix circuit) is thus completed. The second interlayer insulating layer 418 and the third interlayer insulating layer 421 of this embodiment also cover the CMOS circuit shown in Embodiment 1 in actuality. Wiring lines may be formed at the same time the black masks 420a and 420b and the pixel electrode 422 are formed from the same materials that constitute the black masks and the pixel electrode, so that the wiring lines are used as lead out wiring lines (fourth wiring lines or fifth wiring lines) of a driver circuit and a signal processing circuit of the AM-LCD.

In this embodiment, the first wiring lines 401b and 401c provided in the pixel TFT are set to the lowest power supply electric potential. This makes it possible to draw holes generated in the drain end due to hot carrier injection to the first wiring lines, thereby improving the reliability. The first wiring lines 401b and 401c may of course be set to a floating state, but the hole drawing effect cannot be expected in this case.

Embodiment 3

Figure 6:
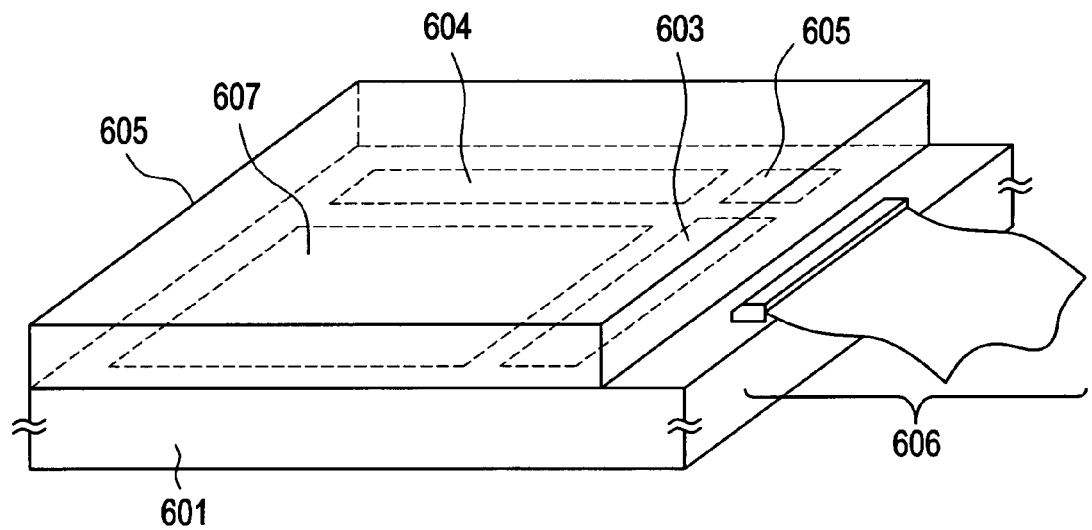
FIG. 6 shows the outside appearance of AM-LCD.

In this embodiment, an AM-LCD is provided with a pixel matrix circuit and a CMOS circuit (a driver circuit and a signal processing circuit constructed of CMOS circuits, to be exact) according to the present invention, and the appearance thereof is shown in FIG. 6.

On an active matrix substrate 601, a pixel matrix circuit 602, a signal line driving circuit (source driver circuit) 603, scanning line driving circuits (gate driver circuits) 604, and a signal processing circuit (including a signal dividing circuit, a D/A converter circuit, and a γ correction circuit) 605 are formed. An FPC (flexible printed circuit) 606 is attached to the active matrix substrate. Denoted by 607 is an opposite substrate.

Figure 7:
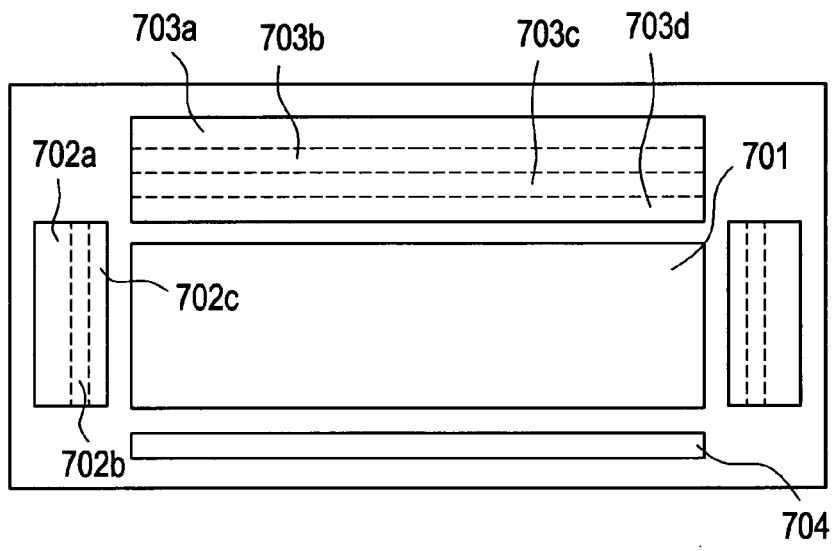
FIG. 7 shows a block structure of AM-LCD.

The various circuits formed on the active matrix substrate 601 are illustrated in detail in a block-diagram of FIG. 7.

In FIG. 7, 701 denotes a pixel matrix circuit that functions as an image display unit. 702a, 702b, and 702c represent a shift register circuit, a level shifter circuit, and a buffer circuit, respectively. The three together constitute a gate driver circuit.

The block diagram of the AM-LCD in FIG. 7 has a pixel matrix circuit sandwiched between gate driver circuits, which share the same gate wiring lines. This means that application of voltage to the gate wiring lines is still possible even after one of the gate drivers fails, thereby giving the AM-LCD redundancy.

703a, 703b, 703c, and 703d represent a shift register circuit, a level shifter circuit, a buffer circuit, and a sampling circuit, respectively. The four together constitute a source driver circuit. A precharge circuit 14 is placed across the pixel matrix circuit from the source driver circuit.

The reliability of an AM-LCD having circuits as those shown in FIG. 6 can be greatly improved by employing the present invention. In this case, CMOS circuits constituting a driver circuit and a signal processing circuit are made in accordance with Embodiment 1 and a pixel matrix circuit is made in accordance with Embodiment 2.

Embodiment 4

This embodiment gives a description on a case where a CMOS circuit is structured differently from Embodiment 1 and a pixel matrix circuit is structured differently from Embodiment 2. To be specific, circuits are given different structures in accordance with the respective specifications the circuits demand.

The basic structure of the CMOS circuit is identical with the structure shown in FIG. 1A and the basic structure of the pixel matrix circuit is identical with the structure shown in FIG. 2A. Therefore only the part that needs explanation is denoted by a symbol and explained in this embodiment.

Figure 8A:
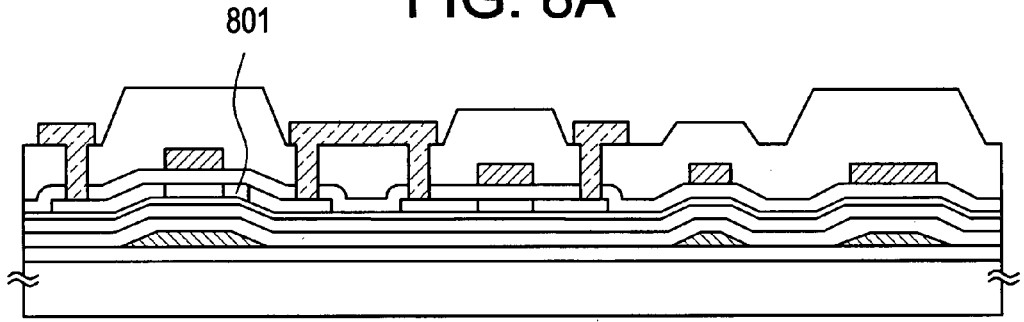
FIG. 8A–D shows a structure of a CMOS circuit or a pixel matrix circuit.

The structure shown in FIG. 8A lacks an LDD region on the source side of the NTFT and has an LDD region 801 only on the drain side. The CMOS circuit, which is used in a driver circuit and a signal processing circuit, is required to operate at high speed and hence resist components that can cause reduction in operation speed have to be removed as much as possible.

In the case of the CMOS circuit according to the present invention, a gate voltage is applied to a first wiring line functioning as a subordinate gate wiring line to obtain the GOLD structure and prevent degradation due to hot carrier injection. However, it is sufficient if an LDD region that overlaps a gate electrode is formed at an end of a channel formation region on the drain region side where hot carriers are injected.

Accordingly, an LDD region at an end of the channel formation region on the source region side is not indispensable. On the contrary, the LDD region on the source region side might work as a resist component. The structure shown in FIG. 8A is therefore effective in improving the operation speed.

The structure of FIG. 8A cannot be applied to a circuit that behaves like a pixel TFT in which a source region and a drain region are switched. Since a source region and a drain region of a CMOS circuit are normally fixed, the CMOS circuit can adopt the structure of FIG. 8A.

Figure 8B:
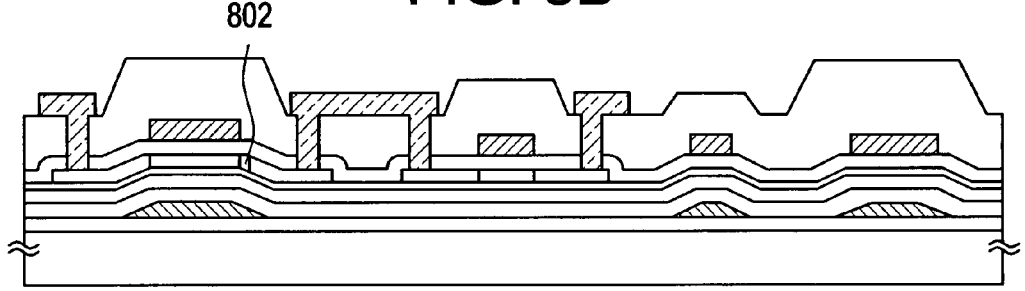

FIG. 8B is basically identical with FIG. 8A but the width of an LDD region 802 in FIG. 8B is narrower than in FIG. 8A. Specifically, the width is set to 0.05 to 0.5 μM (preferably 0.1 to 0.3 μm). The structure in FIG. 8B is capable of not only reducing the resist component on the source region side but also reducing the resist component on the drain region side as much as possible.

This structure is actually suitable for a circuit that is driven at as low voltage as 3 to 5 V and is required to operate at high speed, such as a shift register circuit. Because of the low operation voltage, the narrow LDD region (LDD region that overlaps a gate electrode, strictly speaking) does not raise the problem related to hot carrier injection.

Of course, LDD regions in the NTFT may be completely omitted in some cases if the omission is limited to the shift register circuit. In this case, the NTFT of the shift register circuit has no LDD region while other circuits in the same driver circuit employ the structure shown in FIG. 1A or the structure shown in FIG. 8B.

Figure 8C:
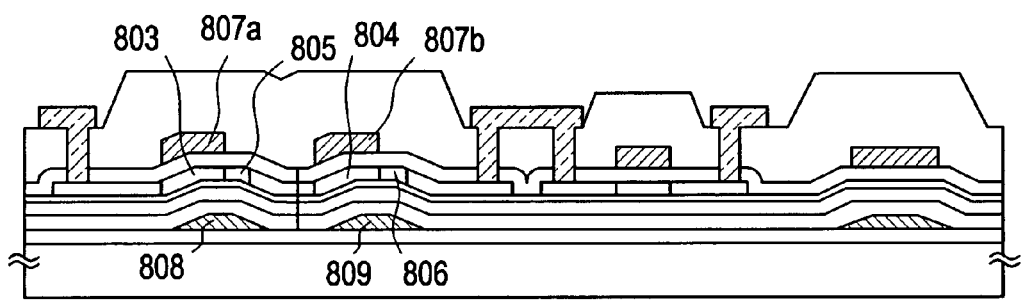

Next, FIG. 8C shows an example of a CMOS circuit with its NTFT having the double gate structure and PTFT having the single gate structure. In this case, LDD regions 805 and 806 are provided only at ends of channel formation regions 803 and 804 which are closer to drain regions.

The width of an LDD region is determined by the amount of light that reaches around in the back side exposure step as shown in FIG. 3D. However, if resist masks are formed by mask alignment, the masks can be designed freely. Forming an LDD region only on one side is easy also in the structure shown in FIG. 8C if a mask is used.

However, forming an LDD region only on one side by the back side exposure method is possible when gate wiring lines (second wiring lines) 807a and 807b are formed so as not to coincide with first wiring lines 808 and 809 as in this embodiment This structure can eliminate the resist component by an LDD region on the source side and the double gate structure has an effect of distributing and easing the electric field applied between the source and the drain.

Figure 8D:
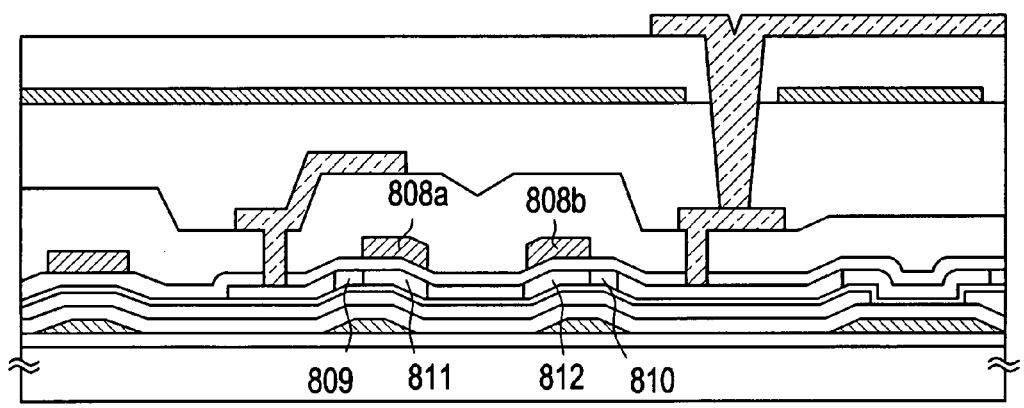

The structure in FIG. 8D is a mode of a pixel matrix circuit. In the structure of FIG. 8D, LDD regions 809 and 810 are provided on either the side closer to the source region or the side closer to the drain region. In other words, no LDD region is provided between two channel formation regions 811 and 812 and the gate wiring layers 808a and 808b.

In the case of a pixel TFT, a source region and a drain region are frequently switched because charging and discharging are repeated. Accordingly, when the pixel TFT has a structure of FIG. 8D, the LDD region can always be in the channel formation region on the drain region side whichever region serves as the drain region. On the other hand, it is effective in increasing ON current (current flowing when the TFT is in an ON state) to omit an LDD region that can be a resist component between the channel formation regions 811 and 812 because there is no electric field concentration between the channel formation regions.

An LDD region is not provided at an end of the channel formation region on the source region-side in the structures of FIGS. 8A to 8D. However, the LDD region may be provided there if it has a narrow width. This structure may be obtained by forming resist masks through mask alignment or by the back side exposure method after the position of the first wiring lines and the second wiring lines is adjusted.

Needless to say, the structure of this embodiment can be combined with Embodiments 1 and 2 and applied to the AM-LCD shown in Embodiment 3.

Embodiment 5

Figure 9A:
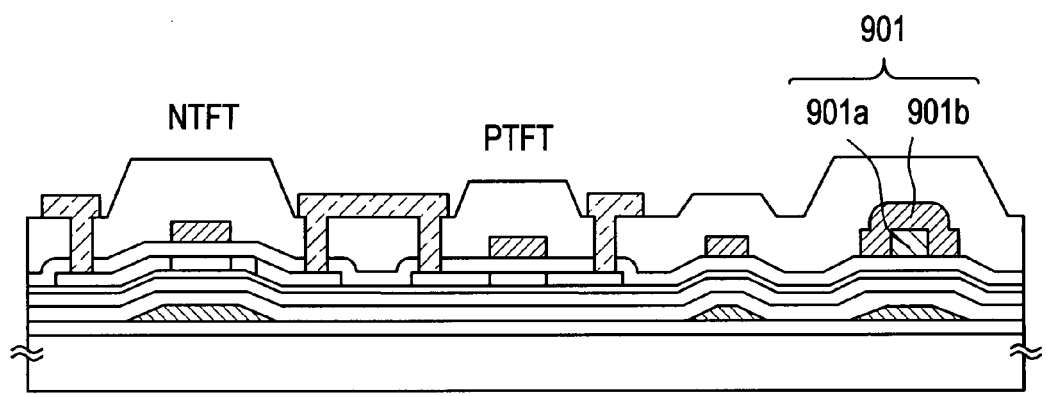
FIGS. 9A–B shows a structure of a CMOS circuit or a pixel matrix circuit.

This embodiment shows with reference to FIG. 9 a case in which a part of the second wiring lines in the CMOS circuit shown in FIG. 1A and in the pixel matrix circuit shown in FIG. 2A is changed in structure. In FIG. 9A, parts structured in the same way as FIG. 1A or FIG. 2A are denoted by the same symbols.

A CMOS circuit in FIG. 9A uses a laminate 901 consisting of a first conductive layer 901a and a second conductive layer 901b for only a part of a second wiring line that corresponds to a power supplying portion. In this specification, a wiring line structure denoted by 901 is called a cladding structure.

In the cladding structure, the material of the first conductive layer 901a may be a conductive film mainly containing an element selected from the group consisting of tantalum, titanium, chromium, tungsten, molybdenum, and silicon, or an alloy film or silicide film containing the above elements in combination. The material of the second conductive layer 901b is desirably a metal film mainly containing (50% or more composition ratio) copper or aluminum.

With this structure, the power supplying portion (the portion denoted by 113d in FIG. 1B) of the second wiring line has the first conductive layer 901a clad by the second conductive layer 901b. Undesirably, this structure might allow aluminum or copper that is an element constituting the first conductive layer 901a to diffuse into a third insulating layer (an insulating layer that is the base of the second wiring line). Therefore a silicon nitride film is formed on the surface of the third insulating layer to prevent diffusion of aluminum or copper effectively.

The structure of this embodiment may also be applied to a pixel matrix circuit. The pixel matrix circuit in FIG. 9B uses a single layer of tantalum film for a gate wiring line and employs the above cladding structure, i.e., laminate 902, first conductive layer 902a and second conductive layer 902b, for a part of the gate wiring line that is required to reduce wiring line resistance (a part of the gate wiring line that does not function as a gate electrode).

Figure 9B:
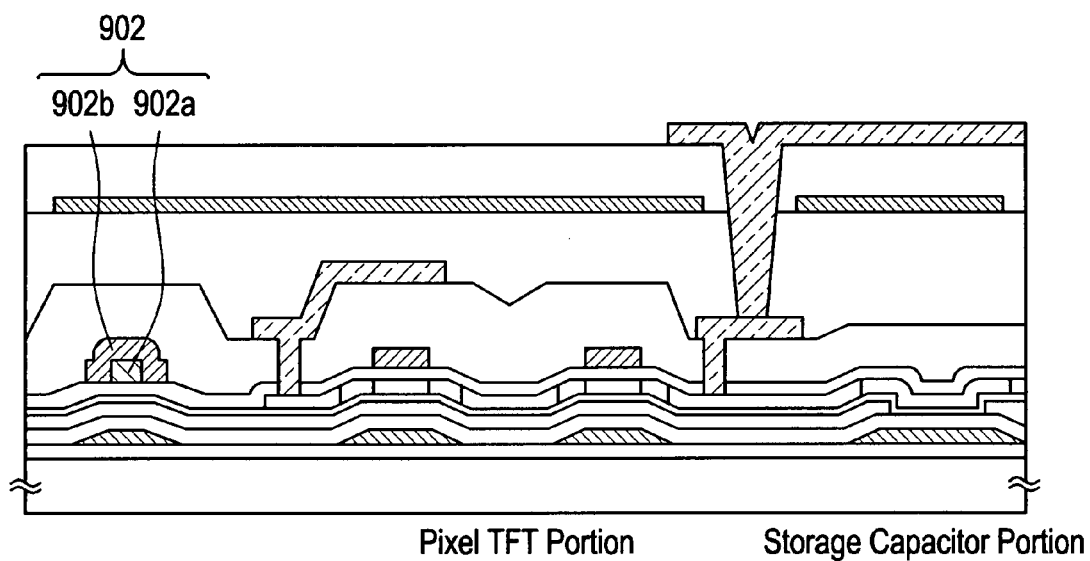

Needless to say, the circuits shown in FIG. 9A and FIG. 9B are both formed on the same substrate at the same time.

The circuits can also be applied to the AM-LCD of Embodiment 3 and can be combined with the structure shown in Embodiment 4.

Embodiment 6

Figure 10A:
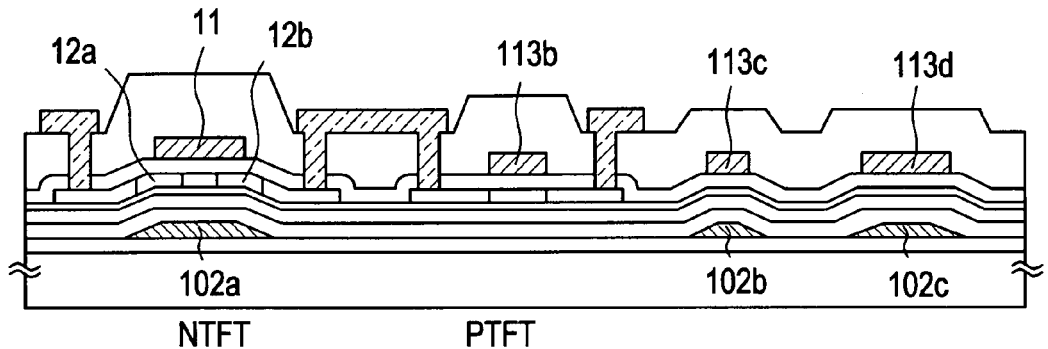
FIG. 10A–B shows a structure of a CMOS circuit or a pixel matrix circuit

This embodiment shows with reference to FIG. 10 a case in which the LDD regions of the NTFTs in the CMOS circuit of FIG. 1A and in the pixel matrix circuit of FIG. 2A are arranged differently. In FIG. 10A, parts structured in the same way as FIG. 1A or FIG. 2A are denoted by the same symbols.

In the CMOS circuit shown in FIG. 10A, the NTFT has a portion where a gate electrode 11 overlaps LDD regions 12a and 12b and a portion where the gate electrode does not overlap the LDD regions. In this structure, the length of the portion where the gate electrode 11 overlaps the LDD regions 12a and 12b is set to 0.1 to 3.5 µm (typically 0.1 to 0.5 µm, preferably 0.1 to 0.3 µm) whereas the length of the portion where the gate electrode 11 does not overlap the LDD regions 12a and 12b is set to 0.5 to 3.5 µm (typically 1.5 to 2.5 µm).

In this structure, the portion where the gate electrode 11 overlaps the LDD regions 12a and 12b exhibits substantially the same effect as the GOLD structure whereas the portion where the gate electrode does not overlap the LDD regions exhibits substantially the same effect as the LDD structure. How much the gate electrode overlaps may be determined by mask alignment or by controlling the amount of light that reaches around.

A feature of this structure is that the LDD regions overlapping the gate electrode prevent degradation of ON current and an LDD region which is provided outside thereof and to which a gate voltage is not applied prevents an increase in OFF current. Accordingly, the structure of FIG. 10A is effective when reduction in OFF current is also required in a CMOS circuit.

Figure 10B:
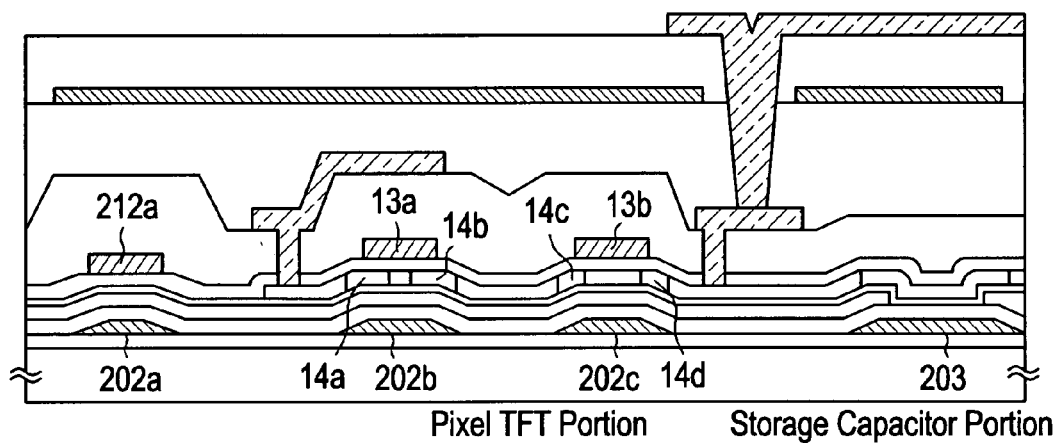

Similarly, in the pixel matrix circuit shown in FIG. 10B, the pixel TFT has portions where gate electrodes 13a and 13b overlap LDD regions 14a to 14d and portions where the gate electrodes 13a and 13b do not overlap the LDD regions 14a to 14d. In this case, the first wiring lines 202b and 202c do not function as subordinate gate wiring lines and hence electric charges in channel formation regions are controlled by the gate electrodes 13a and 13b alone.

With the structure of the pixel TFT described in Embodiment Mode 2, the pixel TFT operates as a complete LDD structure. However, the structure of FIG. 10B can provide a pixel TFT that is strong against hot carrier injection (a pixel TFT in which ON current is not degraded or is degraded less).

The structure of this embodiment can also be applied to the AM-LCD of Embodiment 3 and can be combined freely with the structures shown in Embodiments 4 and 5.

Embodiment 7

Figure 11:
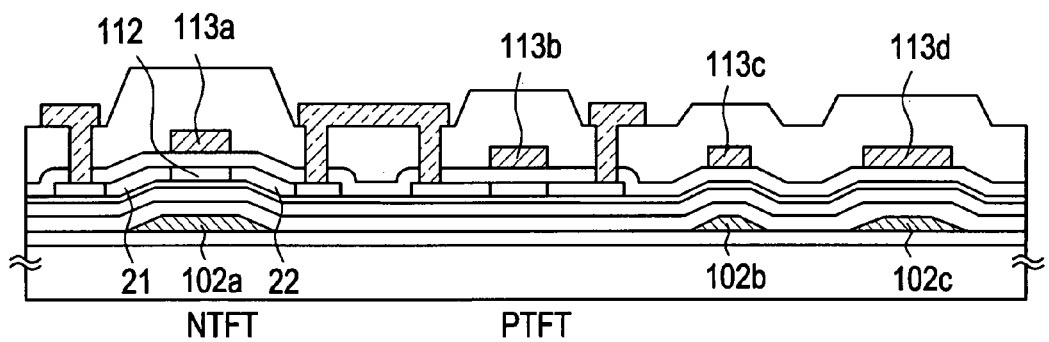
FIG. 11 shows a structure of a CMOS circuit.

This embodiment gives a description with reference to FIG. 11 on a structure for reducing OFF current of an NTFT in a CMOS circuit to be used in a driver circuit.

In FIG. 11, LDD regions 21 and 22 of the NTFT can be divided into portions that substantially overlap a first wiring line 102a and portions that do not overlap the first wiring line 102a. The NTFT in FIG. 11 therefore has an LDD region that does not overlap a gate electrode outside an LDD region that overlaps the gate electrode when a gate voltage is applied to the first wiring line 102a As described in Embodiment 7, this structure has the effect of preventing degradation of ON current which is an advantage of the GOLD structure and, in addition, can provide an electric characteristic of limited increase in OFF current which cannot be attained by the GOLD structure. Therefore a CMOS circuit with very excellent reliability can be obtained.

The description here takes as an example a CMOS circuit but the structure of this embodiment may be applied to a pixel matrix circuit.

In order to obtain the structure of this embodiment, the back side exposure method is not used in the step shown in FIG. 3D in Embodiment 1. The structure of this embodiment is readily obtained when a resist mask wider than the first wiring line is formed by a normal mask alignment and then the phosphorus (n+) doping step is conducted.

The length of the LDD regions (the length of the portions that overlap and do not overlap the gate electrode) is set consulting the range mentioned in Embodiment 7.

The structure of this embodiment can also be applied to the AM-LCD of Embodiment 3 and can be combined freely with the structures shown in Embodiments 4 through 6.

Embodiment 8

This embodiment describes a case in which other methods than thermal crystallization is used to form the active layer shown in Embodiment 1 or 2.

Specifically, the case shown here is of crystallizing an amorphous semiconductor film by a known laser crystallization method Laser light that is typically used is excimer laser light but argon laser light, YAG laser light or the like may be used For excimer laser light, KrF gas, XeCl gas, ArF gas or the like is used as cooling gas. In this embodiment, the excimer laser light is generated by pulse oscillation and is processed into a linear beam through an optical system before it irradiates an irradiation target surface.

The structure of this embodiment can be combined freely with all of the structures of Embodiments 1 through 7.

Embodiment 9

This embodiment describes a case, as a method of forming an active layer, in which the thermal crystallization method shown in Embodiment 1 is used and the catalytic element used in crystallization is removed from the crystalline semiconductor film. To remove the catalytic element, this embodiment employs a technique disclosed in Japanese Patent Application Laid-open No. Hei 10-135468 (corresponding to U.S. patent application Ser. No. 08/951,193) or Japanese Patent Application Laid-open No. Hei 10-135469 (corresponding to U.S. patent application Ser. No. 08/951,819).

The technique described in the publication is to remove a catalytic element used in crystallization of an amorphous semiconductor film by utilizing gettering effect of halogen after crystallization. With this technique, the concentration of the catalytic element in the crystalline semiconductor film can be reduced to $1 \times 10^{17}$ atoms/cm$^3$ or less, preferably to $1 \times 10^{16}$ atoms/cm$^3$.

The structure of this embodiment can be combined freely with all of the structures of Embodiments 1 through 8.

Embodiment 10

This embodiment describes another mode of the gettering step by phosphorus which is shown in Embodiment 1. The basis of the step matches FIG. 1 and hence differences are picked out and explained.

Figure 12A:
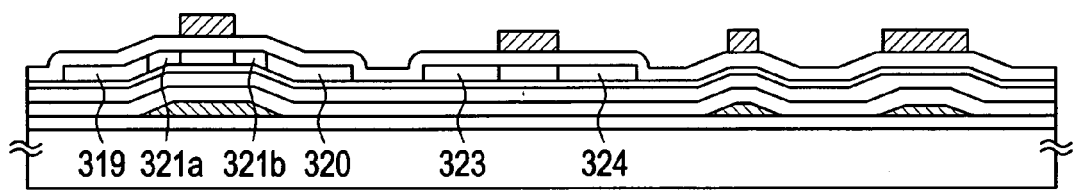
FIGS. 12A–B shows a process of manufacturing a CMOS circuit

First, the state of FIG. 3D is obtained by following the process of Embodiment 1. FIG. 12A shows a state in which the resist masks 318a to 318d are removed from the state of FIG. 3D.

At this point, the source region 319 of the NTFT and the drain region 320 thereof, and the drain region 323 of the PTFT and the source region 324 thereof contain phosphorus in a concentration of $1 \times 10^{19}$ to $1 \times 10^{21}$ atoms/cm$^3$ (preferably $5 \times 10^{20}$ atoms/cm$^3$).

In this state, a heat treatment-step is conducted in a nitrogen atmosphere at 500 to 800° C. for 1 to 24 hours, for example, at 600° C. for 12 hours, in this embodiment. Through the step, the impurity elements belonging to Group 13 or 15 and used in doping are activated. Also, the catalytic element (nickel in this embodiment) remained after the crystallization step moves in the direction of the arrow and is gettered (trapped) in the source regions and drain regions mentioned above owing to the action of phosphorus contained in the regions. As a result, the nickel concentration in the channel formation region can be reduced to $1 \times 10^{17}$ atoms/cm$^3$ or less. (FIG. 12B)

Figure 12B:
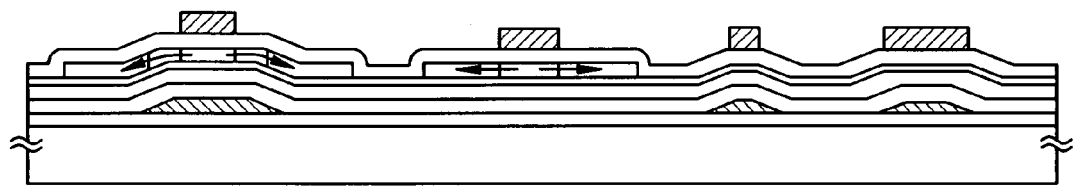

Once the step of FIG. 12B is completed, subsequent steps are conducted in accordance with the steps of Embodiment 1 to complete the CMOS circuit shown in FIG. 3E. Needless to say, similar steps are taken in the pixel matrix circuit.

The structure of this embodiment can be combined freely with all of the structures of Embodiments 1 through 9.

Embodiment 11

This embodiment gives a description with reference to FIG. 13 in a case of manufacturing a CMOS circuit in a step order different from the one in Embodiment 1. Other Group 15 elements than phosphorus may be used instead. Other Group 13 elements than boron may be used instead.

Figure 13A:
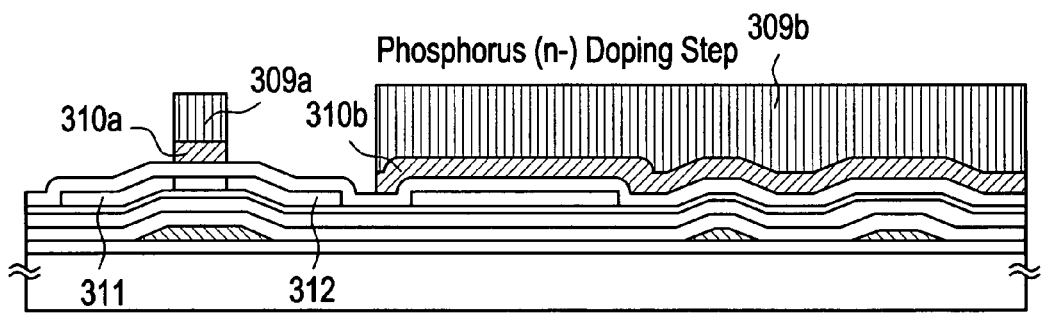
FIGS. 13A–C shows a process of manufacturing a CMOS circuit

First, steps up through the step of FIG. 3B are finished in accordance with the process in Embodiment 1. FIG. 13A shows a state identical with FIG. 3B and the same symbols are used. This is a phosphorus (n−) doping step through which the low concentration impurity regions 311 and 312 are formed.

Figure 13B:
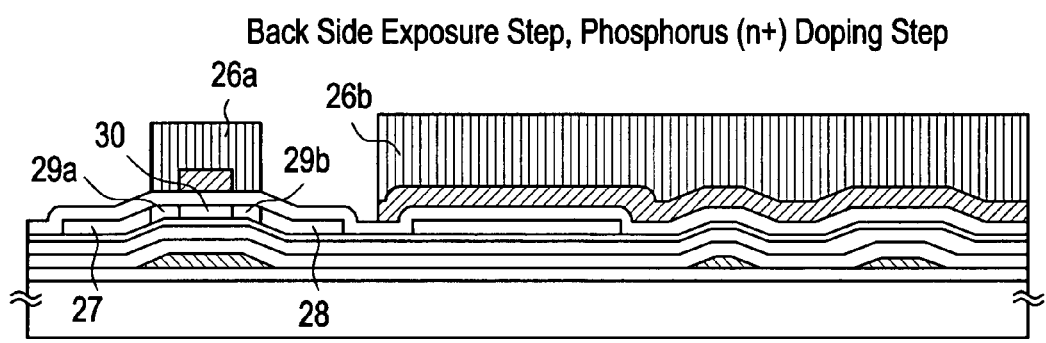

After the resist masks 309a and 309b are removed, the back side exposure method is used to form resist masks 26a and 26b. The phosphorus (n+) doping step is then conducted under the same doping conditions as Embodiment 1 to form a source region 27, a drain region 28, LDD regions 29a and 29b, and a channel formation region 30 of the NTFT. (FIG. 13B).

The resist masks 26a and 26b are removed next. Thereafter resist masks 31a to 31d are formed and the tantalum film 310b is etched to form-second wiring lines 32a to 32c. In this state, the boron (p++) doping step is conducted under the doping conditions of Embodiment 1 to form a drain region 33, a source region 34, and a channel formation region 35 of the PTFT. (FIG. 13C)

In this embodiment, an active layer of the PTFT is not doped with phosphorus before it is doped with boron, whereby the dose of boron can be limited to a minimum. The throughput in the manufacturing process is therefore improved.

Figure 13C:
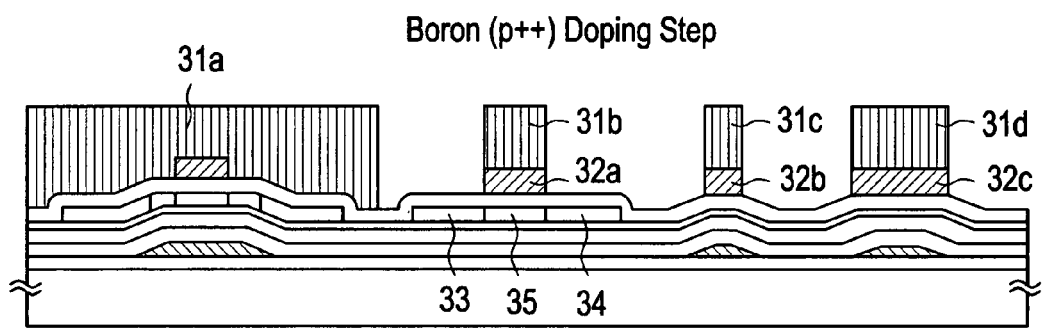

After the step of FIG. 13C is thus completed, fabrication of the CMOS circuit is continued in accordance with the process of Embodiment 1. The structure to be obtained is the one shown in FIG. 3E but is different from Embodiment 1 in that the source region and the drain region of the PTFT do not contain phosphorus.

The manufacturing process of this embodiment only changes the order of the doping process of the elements belonging to Group 13 or Group 15 in Embodiment 1. Therefore, as for the other conditions, please refer to that in Embodiment 1.

The manufacturing process of this embodiment is described taking as an example a CMOS circuit but, needles to say, a pixel matrix circuit is formed at the same time.

The structure of this embodiment can be combined freely with any of the structures of Embodiments 4 through 10.

Embodiment 12

Figure 14:
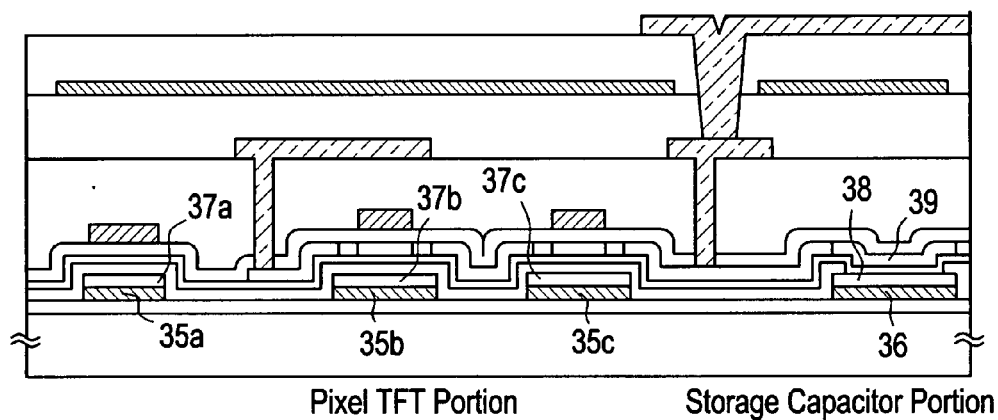
FIG. 14 shows a structure of a pixel matrix circuit.

This embodiment shows with reference to FIG. 14 a case in which the storage capacitor of the pixel matrix circuit shown in Embodiment Mode 2 is structured differently. The description is limited to the structure of the storage capacitor because the rest is the same as the pixel matrix circuit shown in FIG. 2A.

In FIG. 14, a tantalum film that is the material of first wiring lines and a tantalum oxide film that is the material of first insulating layers are layered to form a laminate, and both are etched into the same shape. As a result, first wiring lines 35a to 35c and a capacitor wiring line 36 are formed and first insulating layers 37a to 37c and 38 having the same shape as the wiring lines are formed on the wiring lines.

In order to obtain this structure, a technique for etching the tantalum oxide film and the tantalum film while keeping the selective ratio is required. In this embodiment, the tantalum oxide film is removed by dry etching using a fluorine-based gas while the tantalum film can be left by time controlling because the selective ratio with respect to the tantalum film can be secured to a certain degree. Then the tantalum film alone is etched by wet etching with the tantalum oxide film as a mask.

Though not shown in FIG. 14, it is effective to etch the first wiring lines (or capacitor wiring line) into a tapered shape when the first wiring line (or capacitor wiring line) and the first insulating layers are patterned into the same shape.

As described above, the capacitor wiring line 36, the first insulating layer (tantalum oxide film) 38, and a semiconductor region 39 form the storage capacitor in this embodiment.

This embodiment may of course be carried out also when the first wiring lines are formed from a conductive film mainly containing an element selected from the group consisting of chromium (Cr), titanium (Ti), tungsten (W), molybdenum (Mo), and silicon (Si), or an alloy film or silicide film containing the above elements in combination, or a laminate of the conductive films, the alloy films or the silicide films.

The structure of this embodiment can be combined freely with any of the structures of Embodiments 3 through 11.

Embodiment 13

Figure 15:
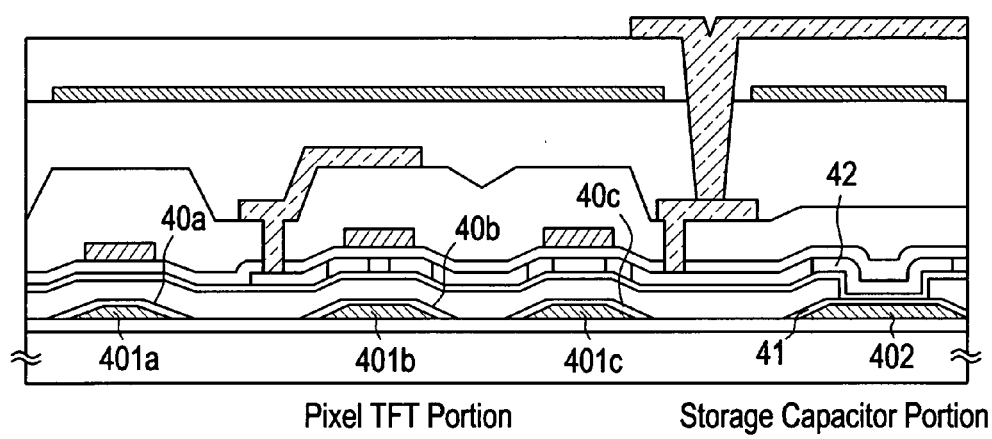
FIG. 15 shows a structure of a pixel matrix circuit

This embodiment shows with reference to FIG. 15 a case in which the storage capacitor of the pixel matrix circuit shown in Embodiment Mode 2 is structured differently. The description is limited to the structure of the storage capacitor because the rest is the same as the pixel matrix circuit shown in FIG. 2A.

After the first wiring lines 401a to 401c and the capacitor wiring line 402 are formed as in FIG. 4A, thermal oxidization is performed on the first wiring lines and the capacitor wiring line formed of a tantalum film in this embodiment. Through the thermal oxidization, tantalum oxide films 40a to 40c and 41 are formed. The tantalum oxide films are used as dielectric of the storage capacitor.

The thermal oxidization step is carried out in a temperature range of 450 to 600° C. (preferably 450 to 500° C. when a glass substrate is used). The thickness of the film increases in proportion to temperature and time, and the thickness of the first wiring lines is reduced that much. Therefore it is desirable to form the tantalum film rather thick from the beginning.

When employing this embodiment, the tantalum oxide film can be formed thin with good controllability to have a thickness of 10 to 50 nm and an excellent film quality. Since the capacity of the storage capacitor is larger when the dielectric is thinner, the storage capacitor formed can have a very large capacity.

As described above, the storage capacitor in this embodiment is composed of the capacitor wiring line 402, the first insulating layer (the tantalum oxide film formed by thermal oxidization) 41, and a semiconductor region 42.

This embodiment may of course be carried out also when the first wiring lines are formed from a conductive film mainly containing an element selected from the group consisting of chromium (Cr), titanium (Ti), tungsten (W), molybdenum (Mo), and silicon (Si), or an alloy film or silicide film containing the above elements in combination, or a laminate of the conductive films, the alloy films, or the silicide films.

The tantalum oxide film may be formed by a known anode oxidization method instead of oxidizing it by thermal oxidization.

The structure of this embodiment can be combined freely with any of the structures of Embodiments 3 through 11.

Embodiment 14

This embodiment describes a case in which other materials than a tantalum film are used for first wiring lines and second wiring lines. The description will be given with reference to FIG. 16. This embodiment deals with a technique particularly effective in a manufacturing process that includes a high temperature heat treatment step at 700 to 1150° C., such as the one shown in Embodiment 9.

The first wiring lines are formed prior to formation of an active layer and hence, if the active layer is to be thermally oxidized, the first wiring lines are also subjected to high temperature heat treatment. In this case, an element constituting the first wiring lines is coupled to oxygen to raise a problem of increased wiring line resistance. This embodiment is about a technique for solving that problem.

Figure 16:
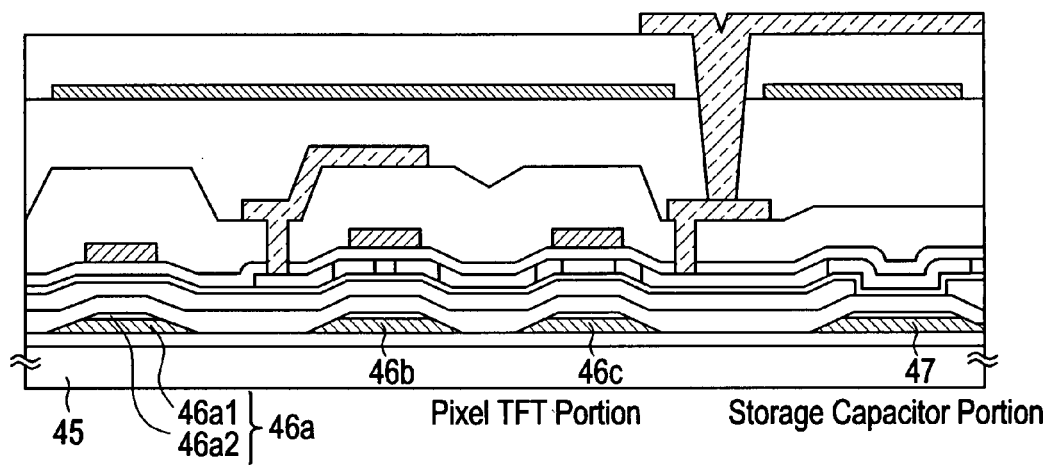
FIG. 16 shows a structure of a pixel matrix circuit

A substrate used in this embodiment is a quartz substrate 45 having high heat resistance as shown in FIG. 16. A silicon substrate on which a thermal oxide film is formed, a ceramic substrate on which an insulating film is formed, or the like may of course be used instead.

For the material of first wiring lines 46a to 46c and of a capacitor wiring line 47, a tungsten silicide (WSix: x=2 to 25) film 46a1 and a silicon (Si) film 46a2 are layered to form a laminate. The layer order may be reverse, or the laminate may have a three-layer structure in which silicon films sandwich a tungsten silicide film.

Only the first wiring line 46a is described here but, needless to say, the first wiring lines 46b and 46c and the capacitor wiring line 47 also are a laminate of a tungsten silicide film and a silicon film.

With these materials, the wiring line resistance is not increased in the tungsten silicide film 46a1 after the high temperature heat treatment step at 700 to 1150° C. This is because excess silicon contained in the tungsten silicide film preemptively couples with oxygen and prevents oxygen from coupling with tungsten.

Other metal silicide films, for example, a molybdenum silicide (MoSix) film, a titanium silicide (TiSix) film, a cobalt silicide (CoSix) film, a tantalum silicide (TaSix) film, etc., may be used instead of the tungsten silicide film.

If a simple metal film (typically, a tantalum film, a titanium film, a tungsten film, or a molybdenum film) is used for the first wiring lines, a silicon film is provided so as to contact with the top face and/or the bottom face of the simple metal film. This prevents oxidization of the simple metal film and an increase in wiring line resistance.

If the simple metal film such as a tantalum film or a tungsten film is sandwiched between silicon films forming a three-layer structure, the first wiring lines formed can withstand a high temperature process as the one used in this embodiment.

The structure of this embodiment can be combined freely with any of the structures of Embodiments 1 through 13.

Embodiment 15

Figure 17:
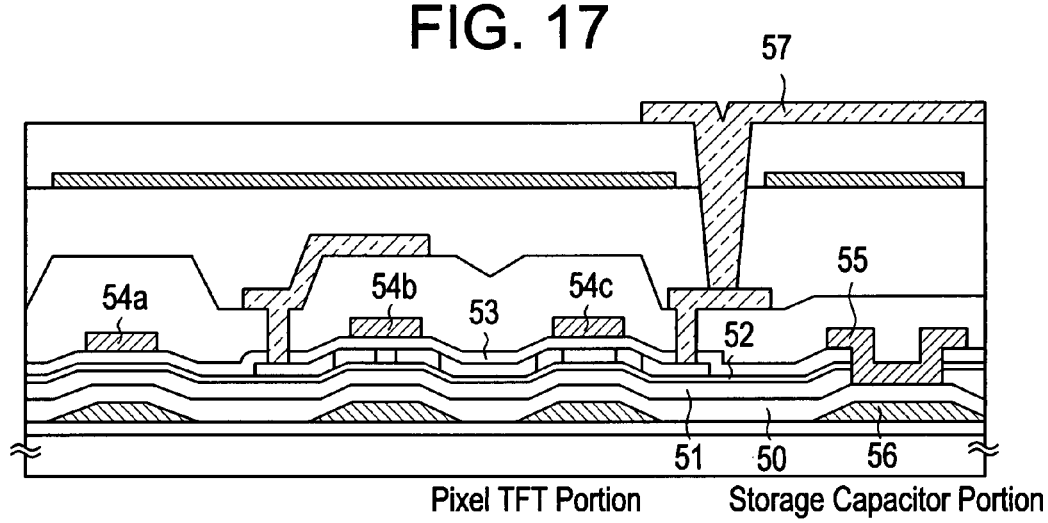
FIG. 17 shows a structure of a pixel matrix circuit.

This embodiment shows with reference to FIG. 17 a case in which the storage capacitor of the pixel matrix circuit shown in Embodiment Mode 2 is structured differently. The description is limited to the structure of the storage capacitor because the rest is the same as the pixel matrix circuit shown in FIG. 2A.

In this embodiment, a first insulating layer 50 is formed first and then a second insulating layer 51, a silicon oxide film 52, and an amorphous silicon film (not shown in the drawing) are formed successively without exposing them to the air. The amorphous silicon film is then crystallized to form an active layer from the resultant crystalline silicon film, and a third insulating layer 53 is formed to cover the active layer.

After the third insulating layer 53 is formed, the third insulating layer 53, the silicon oxide film 52, and the second insulating layer 51 are etched at once in a portion to become the storage capacitor (above a capacitor wiring line) in this embodiment. The first insulating layer 50 is exposed by the etching.

In this state, second wiring lines 54a to 54c and an upper capacitor wiring line 55 are formed. The second wiring lines 54a to 54c and the upper capacitor wiring line 55 are on the same layer of course.

This embodiment is thus characterized in that the storage capacitor is composed of a capacitor wiring line 56, the first insulating layer 50, and the upper capacitor wiring line 55. In this case, however, one of the capacitor wiring line 56 and the upper capacitor wiring line 55 has to be electrically connected to a pixel electrode 57.

The structure of this embodiment can be combined freely with any of the structures of Embodiments 3 through 14.

Embodiment 16

This embodiment shows a case in which the storage capacitor of the pixel matrix circuit shown in Embodiment Mode 2 is structured differently. The description is limited to the structure of the storage capacitor because the rest is the same as the pixel matrix circuit shown in FIG. 2A.

In the structure of the storage capacitor shown in FIG. 2A, an upper capacitor wiring line (not shown in the drawing) is formed on the third insulating layer 211 above the capacitor wiring line 203. As a result, a first storage capacitor composed of the capacitor wiring line 203, the first insulating layer 204, and the semiconductor region 210 is connected in parallel to a second storage capacitor composed of the semiconductor region 210, the third insulating layer 211, and the upper capacitor wiring line.

One storage capacitor is laid on top of the other and therefore a large capacity can be secured with a small area when this embodiment is carried out.

The structure of this embodiment can be combined freely with any of the structures of Embodiments 1 through 14.

Embodiment 17

This embodiment gives a description on the position where a storage capacitor is to be formed in a pixel matrix circuit. The description will be given with reference to FIGS. 18A and 18B. FIG. 18B is a sectional view taken along the line A–A' in FIG. 18A. The same parts are denoted by the same symbols in FIGS. 18A and 18B.

Figure 18A:
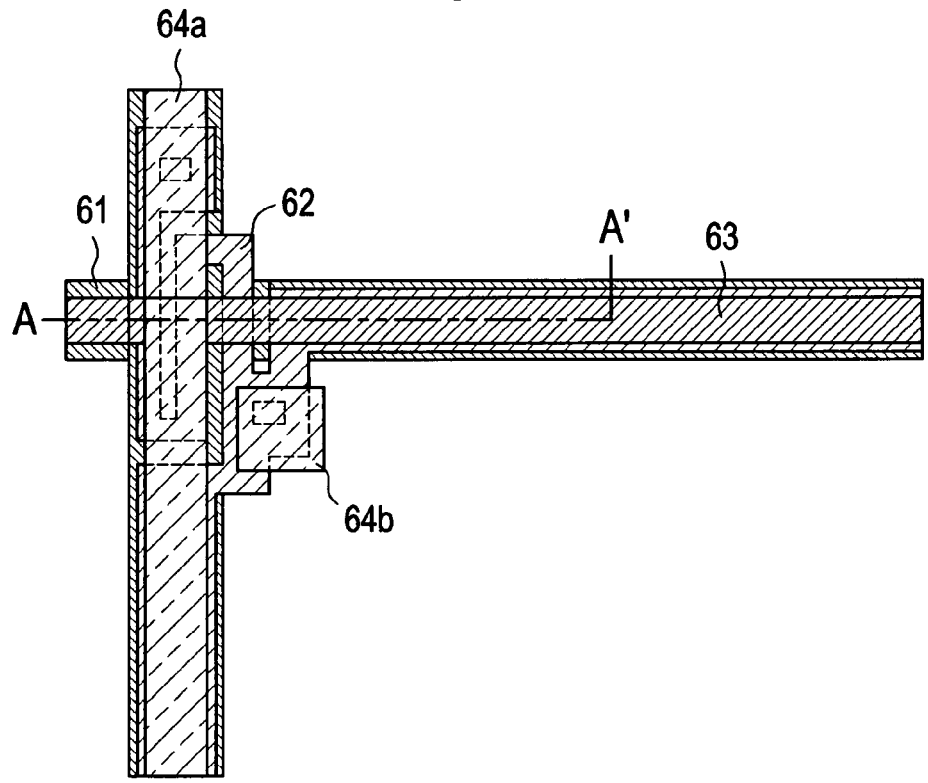
FIGS. 18A–B shows a structure of a pixel matrix circuit
Figure 18B:
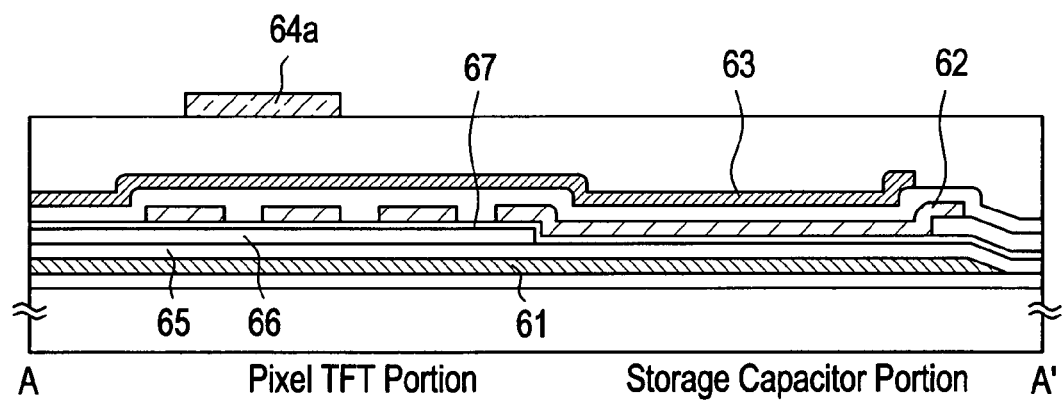

In FIG. 18A, 61 denotes a first wiring line, 62, a semiconductor layer, 63, a second wiring line (specifically, a gate wiring line), and 64a and 64b, third wiring lines (specifically, 64a represents a source wiring line whereas 64b represents a drain wiring line).

The first wiring line 61 is formed so as to overlap under the second wiring line 63 and under the third wiring line (source wiring line) 64a, and has a mesh-like (matrix-like) pattern. That is, the electric potential is the same along the entire length of the first wiring line 61 (preferably at the lowest power supply electric potential).

The semiconductor layer 62 is formed above the first wiring line through a first insulating layer 65, a second insulating layer 66, and a silicon oxide film 67. The second insulating layer 66 is removed from storage capacitor portions, so that each storage capacitor is composed of the first wiring line 61, the first insulating layer 65, the silicon oxide film 67, and the semiconductor layer 62.

This embodiment is characterized in that the storage capacitor portions are formed under the second wiring line 63 and under the third wiring line (source wiring line) 64a. This improves the aperture ratio and a bright image display can be obtained. This also shields the storage capacitor against light and hence can prevent leakage of electric charges from the storage capacitor.

The semiconductor layer in this embodiment is patterned such that a pixel TFT has the triple gate structure, but is not limited thereto.

The structure of this embodiment can be combined freely with any of the structures of Embodiments 3 through 14.

Embodiment 18

This embodiment gives a description on the position where a storage capacitor is to be formed in a pixel matrix circuit. The description will be given with reference to FIGS. 19A and 19B. FIG. 19B is a sectional view taken along the line A–A' in FIG. 19A. The same parts are denoted by the same symbols in FIGS. 19A and 19B.

Figure 19A:
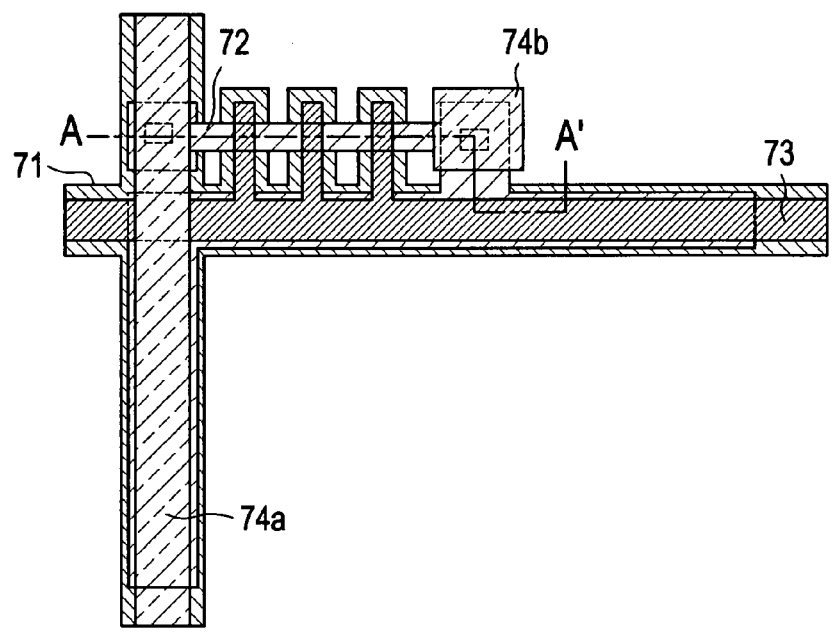
FIGS. 19A–B shows a structure of a pixel matrix circuit
Figure 19B:
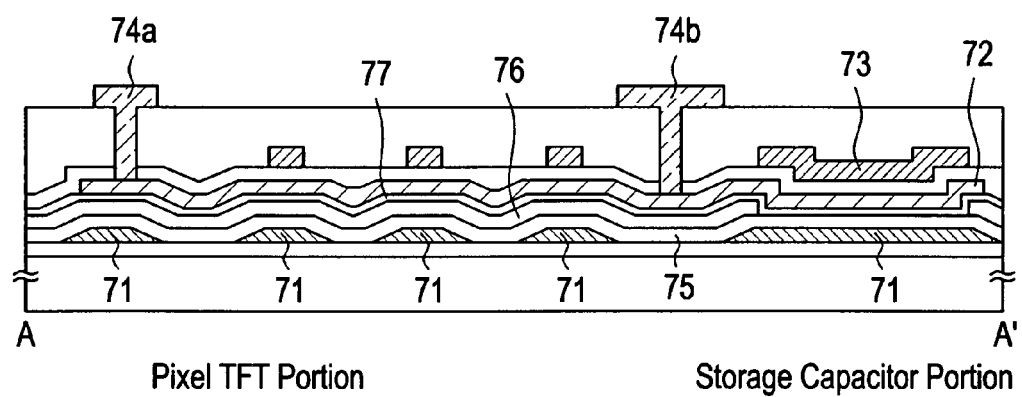

In FIG. 19A, 71 denotes a first wiring line, 72, a semiconductor layer, 73, a second wiring line (specifically, a gate wiring line), and 74a and 74b, third wiring lines (specifically, 74a represents a source wiring line whereas 74b represents a drain wiring line).

The first wiring line 71 is formed so as to overlap under the second wiring line 73 and under the third wiring line (source wiring line) 74a, and has a mesh-like (matrix-like) pattern. That is, the electric potential is the same along the entire length of the first wiring line 71 (preferably at the lowest power supply electric potential).

The semiconductor layer 72 is formed above the first wiring line through a first insulating layer 75, a second insulating layer 76, and a silicon oxide film 77. The second insulating layer 76 is removed from storage capacitor portions, so that each storage capacitor is composed of the first wiring line 71, the first insulating layer 75, the silicon oxide film 77, and the semiconductor layer 72.

This embodiment is characterized in that the storage capacitor portions are formed under the second wiring line 73 and under the third wiring line (source wiring line) 74a. This improves the aperture ratio and a bright image display can be obtained. This also shields the storage capacitor against light and hence can prevent leakage of electric charges from the storage The semiconductor layer in this embodiment is patterned such that a pixel TFT has the triple gate structure, but is not limited thereto.

The structure of this embodiment can be combined freely with any of the structures of Embodiments 3 through 14.

Embodiment 19

This embodiment gives a description on the position where a storage capacitor is to be formed in a pixel matrix circuit. The description will be given with reference to FIG. 20.

Figure 20:
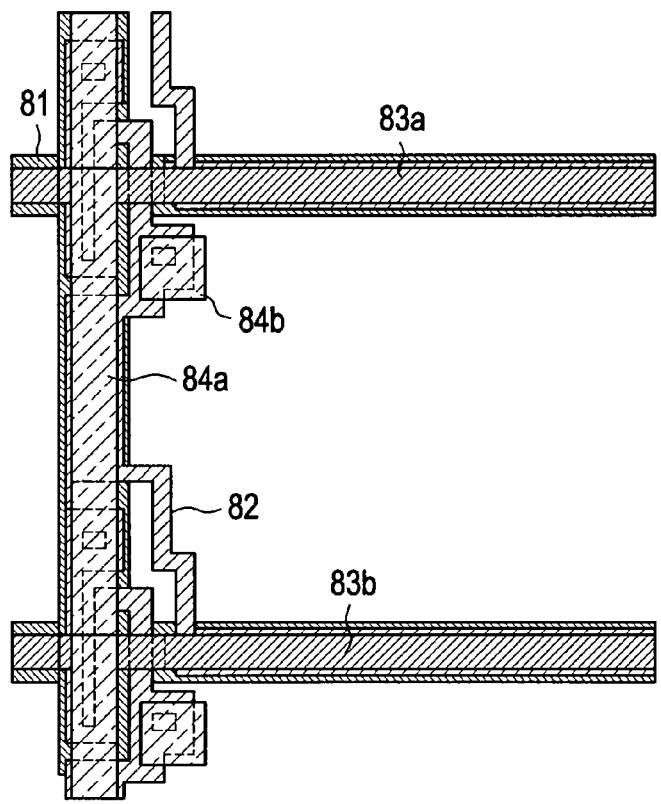
FIG. 20 shows a structure of a pixel matrix circuit.

In FIG. 20, 81 denotes a first wiring line, 82, a semiconductor layer, 83a and 83b, second wiring lines (specifically, gate wiring lines), and 84a and 84b, third wiring lines (specifically, 84a represents a source wiring line whereas 84b represents a drain wiring line).

The first wiring line 81 is formed so as to overlap under the second wiring lines 83 and under the third wiring line (source wiring line) 84a, and has a mesh-like (matrix-like) pattern. That is, the electric potential is the same along the entire length of the first wiring line 81 (preferably at the lowest power supply electric potential).

The semiconductor layer 82 is formed above the first wiring line through a first insulating layer, a second insulating layer, and a silicon oxide film. The second insulating layer is removed from storage capacitor portions, so that each storage capacitor is composed of the first wiring line 81, the first insulating layer, the silicon oxide film, and the semiconductor layer 82.

This embodiment is characterized in that the storage capacitor portions are formed under the second wiring line 83b and under the third wiring line (source wiring line) 84a. The difference from Embodiments 17 and 18 resides in that when forming the storage capacitor under a gate wiring line, it is formed under a gate wiring line that is not selected (the gate wiring line 83b adjacent to the selected gate wiring line 83a).

A gate voltage (a voltage applied to a gate wiring line to bring a TFT into an ON state) is not applied to the storage capacitor in this embodiment. Therefore a large parasitic capacitance is not formed between the second wiring lines (gate wiring lines) and the semiconductor layer.

This structure improves the aperture ratio and a bright image display can be obtained. It also shields the storage capacitor against light and hence can prevent leakage of electric charges from the storage capacitor.

The semiconductor layer in this embodiment is patterned such that a pixel TFT has the triple gate structure, but is not limited thereto.

The structure of this embodiment can be combined freely with any of the structures of Embodiments 3 through 14.

Embodiment 20

This embodiment shows a case in which different structures are given to TFTs arranged in driver circuits (or other signal processing circuits) in accordance with the difference in operation voltage for the optimal circuit design.

The CMOS circuit shown in FIG. 1A is used to construct a gate driver circuit, a source driver circuit, and other signal processing circuits of an AM-LCD. The operation voltage of the CMOS circuit varies depending on which of these circuits it constitutes. For example, shift register circuits 702a and 703a in FIG. 7 have a low operation voltage, about 5 V, and are required to operate at high speed whereas buffer circuits 702c and 703c have a high operation voltage of 16 to 20 V.

In the case of a shift register circuit, hot carrier injection hardly matters and no serious problem is caused if it does not have the GOLD structure because of its low operation voltage. On the contrary, sometimes it is preferred not to provide a first wiring line if formation of a parasitic capacitance between a first wiring line (subordinate gate wiring line) and an active layer is to be avoided. In the case of a buffer circuit, on the other hand, its high operation voltage makes hot carrier injection countermeasures indispensable. Then the structure shown in FIG. 1A is effective.

As described above, there are cases where one circuit in a driver circuit employs the CMOS circuit of FIG. 1A whereas another circuit in the same driver circuit uses a CMOS circuit with an NTFT that has an ordinary LDD structure in accordance with difference in operation voltage between the one circuit and the other circuit while sharing the same substrate.

Other signal processing circuits than a driver circuit (a D/A converter circuit, a γ correction circuit, a signal dividing circuit, or the like) are low in operation voltage and hence may use a CMOS circuit having an NTFT that has an ordinary LDD structure.

The structure of this embodiment can be combined freely with any of Embodiments 1 through 20.

Embodiment 21

In the CMOS circuit shown in FIG. 1, the first wiring line 102a is provided in the NTFT but not in the PTFT. However, a conductive layer on the same layer as the first wiring line may be provided under the active layer of the PTFT.

The conductive layer to be placed under the active layer of the PTFT has such an electric potential as not to influence the operation of the PTFT (specifically, the lowest power supply electric potential or to the same effect) or is kept to a floating state. That is, the conductive layer is prevented from doing no other function than the one as a light-shielding layer.

The pixel matrix circuit shown in FIG. 2 is an NTFT. However, the pixel matrix circuit may be a PIFT if a first wiring line functioning as a light-shielding layer is provided under its active layer.

The structure of this embodiment can be combined freely with any of Embodiments 1 through 21.

Embodiment 22

This embodiment describes a case in which the thickness of a first insulating layer and/or second insulating layer is varied to reflect a difference in operation voltage.

In an AM-LCD shown in FIG. 6, a pixel matrix circuit 607 has an operation voltage of 16 V whereas the operation voltage of driver circuits 603 and 604, or a signal processing circuit 605 is 10 V or less, or even 5 V or less.

Specifically, level shifter circuits 702b and 703b, buffer circuits 702c and 703c, and a sampling circuit 703d in FIG. 7 have an operation voltage close to that of a pixel matrix circuit 701. (16 to 20 V). On the other hand, shift register circuits 702a and 703a or a signal processing circuit (not shown in the drawing) have a low operation voltage of 5 to 10 V.

For the shift register circuit and signal processing circuit as above, high speed operation is the most important factor and hence it is effective to make the gate insulating film as thin as possible to increase the operation speed of the TFT. On the other hand, the high speed operation ability is not required much for the buffer circuit and the pixel matrix circuit and hence forming a thick gate insulating film to improve the withstand voltage characteristic is effective.

Thus, when the operation voltage is different and specifications required for circuits are accordingly different, it is effective to vary the thickness of the gate insulating film to suit a required specification. Since the first insulating layer and the second insulating layer in the NTFT structure of the present invention can function as gate insulating films, the thickness thereof can be changed to suit the respective circuits.

For example, in a circuit having a low operation voltage and required to operate at high speed, such as a shift register circuit and a signal processing circuit (signal dividing circuit or the like), it is effective to make the first insulating layer thick (200 to 400 nm) while making the second insulating layer thin (10 to 30 nm). If the first insulating layer is as thin as the second-insulating layer, the operation speed is improved but the parasitic capacitance is increased to impair the frequency characteristic, which is not desirable. In some cases, the first wiring line may not be provided in a shift register circuit or the like as in Embodiment 21.

When the operation voltage is high as in a buffer circuit, a sampling circuit, a pixel matrix circuit, or the like, it is desirable to make the second insulating layer as thick as 100 to 200 nm to enhance the withstand voltage characteristics as a gate insulating film.

In a pixel matrix circuit, the influence of the first wiring line has to be as small as possible and hence the first insulating layer may be as thick as 200 to 400 nm. This makes it possible to for the first wiring line provided in the pixel TFT to function as a light-shielding layer.

As described above, it is effective to vary the thickness of the gate insulating film (the first insulating layer and/or the second insulating layer) between circuits that are different from one another in operation voltage.

The structure of this embodiment can be combined freely with any of Embodiments 1 through 22.

Embodiment 23

Figure 21:
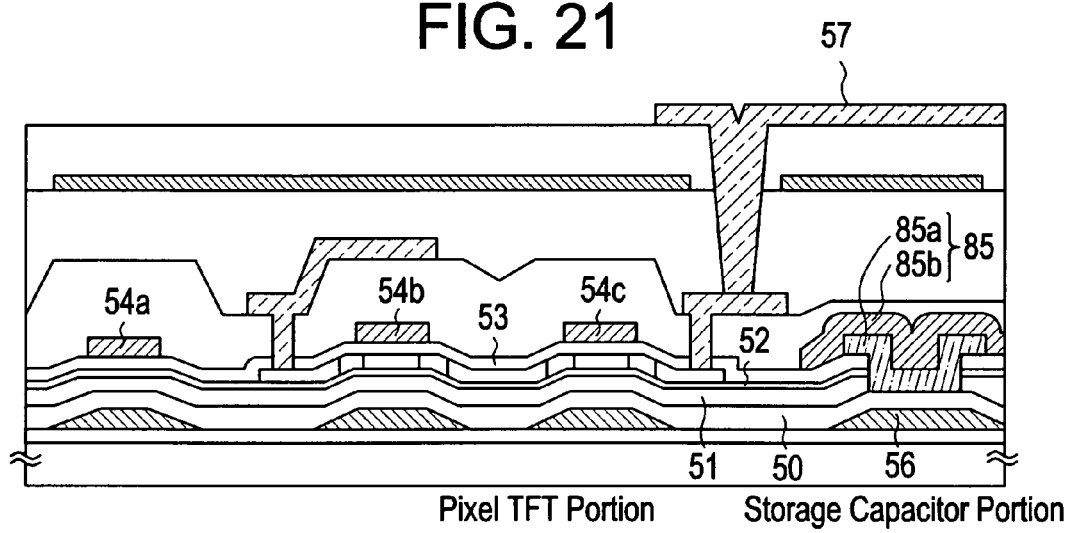
FIG. 21 shows a structure of a pixel matrix circuit.

This embodiment shows with reference to FIG. 21 a case in which the storage capacitor of the pixel matrix circuit shown in Embodiment 15 is structured differently. The description is limited to the structure of the storage capacitor because the rest is the same as the pixel matrix circuit shown in FIG. 17.

The structure of this embodiment is almost the same as Embodiment 17 but departs from there to a slightly different process after the third insulating layer is partially etched.

After the third insulating layer 53 is partially etched in the storage capacitor portion, a conductive film 85a mainly containing aluminum is formed first in this embodiment. A tantalum film is formed next and patterned to form the second wiring lines 54a to 54c and a protective wiring line 85b from the tantalum film.

In this embodiment, the conductive film 85a mainly containing aluminum and the protective film 85b formed of a tantalum film constitute an upper capacitor wiring line 85. That is, the storage capacitor is composed of the capacitor wiring line 56 that is formed of a tantalum film, the first insulating layer 50 that is formed of a tantalum oxide film, and the conductive film 85a mainly containing aluminum. The protective wiring line 85b functions as a part of the upper capacitance electrode and also functions as a protective film for protecting the conductive film 85a mainly containing aluminum from heat.

The structure of this embodiment can be combined freely with any of Embodiments 3 through 14, 15, 16, and 20 through 23.

Embodiment 24

The TFT structure of the present invention can be applied not only to electro-optical devices such as AM-LCDs but to semiconductor circuits of every kind. It may be applied to microprocessors such as RISC processors and ASIC processors, to signal processing circuits such as D/A converters, and to high frequency circuits for portable equipment (mobile telephones, PHS, and mobile computers).

It is possible to obtain a semiconductor device having a three-dimensional structure in which an interlayer insulating film is formed on a conventional MOSFET and the present invention is applied thereto to form a semiconductor circuit. The present invention thus is applicable to all of the semiconductor devices that currently employ LSIs. The present invention may be applied to the SOI structure (a TFT structure using a single crystal semiconductor thin film) such as SIMOX, Smart-Cut (trademark of SOITEC), and ELTRAN (trademark of Canon, Inc.).

The semiconductor circuits of this embodiment can be obtained by any structure resulting from combinations of Embodiments 1 through 24.

Embodiment 25

A CMOS circuit and pixel matrix circuit formed by carrying out the present invention can be applied to various electro-optical devices and semiconductor circuits. That is, the present invention is applicable to all of electronic equipment that incorporates those electro-optical devices and semiconductor circuits as components.

Given as such electronic equipment are video cameras, digital cameras, projectors, projection TVs, head mounted displays (goggle type displays), automobile navigation systems, personal computers, portable information terminals (mobile computers, mobile telephones, electronic books or the like), etc. Examples of those are shown in FIG. 22.

Figure 22A:
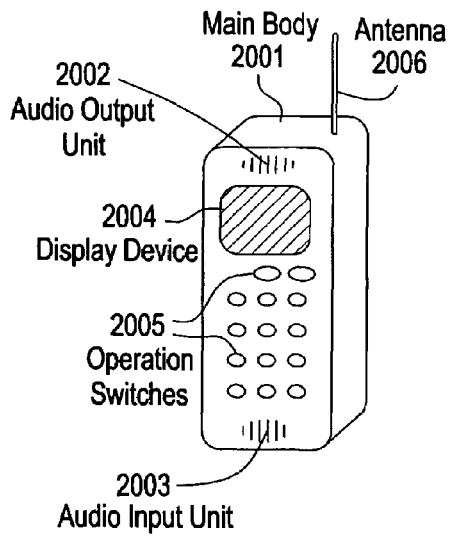
FIGS. 22A–F shows examples of electronic devices

FIG. 22A shows a mobile telephone, which is composed of a main body 2001, an audio output unit 2002, an audio input unit 2003, a display device 2004, operation switches 2005, and an antenna 2006. The present invention is applicable to the audio output unit 2002, the audio input unit 2003, the display device 2004, and other signal controlling circuits.

Figure 22B:
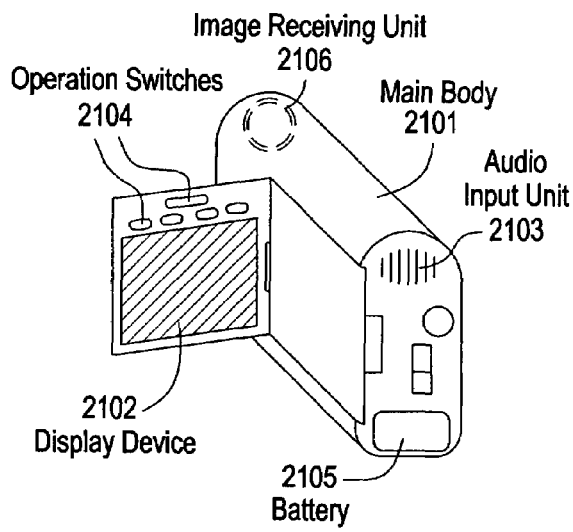

FIG. 22B shows a video camera, which is composed of a main body 2101, a display device 2102, an audio input unit 2103, operation switches 2104, a battery 2105, and an image receiving unit 2106. The present invention is applicable to the display device 2102, the audio input unit 2103, and other signal controlling circuits.

Figure 22C:
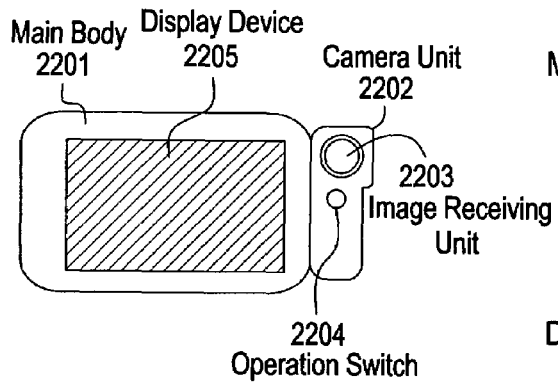

FIG. 22C shows a mobile computer, which is composed of a main body 2201, a camera unit 2202, an image receiving unit 2203, operation switches 2204, and a display device 2205. The present invention is applicable to the display device 2205 and other signal controlling circuits.

Figure 22D:
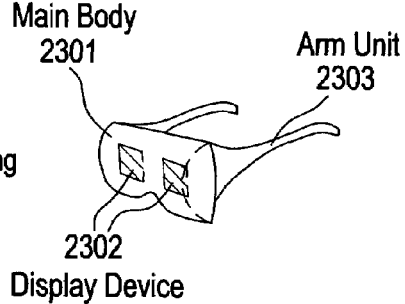

FIG. 22D shows a goggle type display, which is composed of a main body 2301, display devices 2302, and arm units 2303. The present invention is applicable to the display devices 2302 and other signal controlling circuits.

Figure 22E:
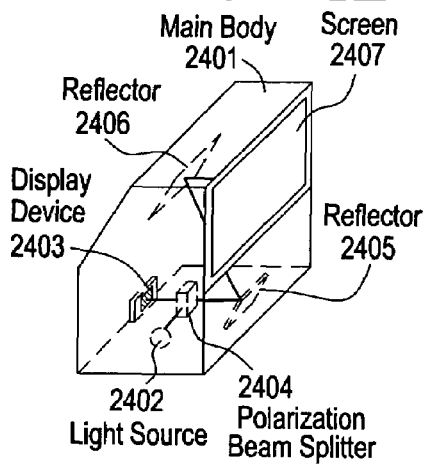

FIG. 22E shows a rear projector, which is composed of a main body 2401, a light source 2402, a display device 2403, a polarization beam splitter 2404, reflectors 2405 and 2406, and a screen 2407. The present invention is applicable to the display device 2403 and other signal controlling circuits.

Figure 22F:
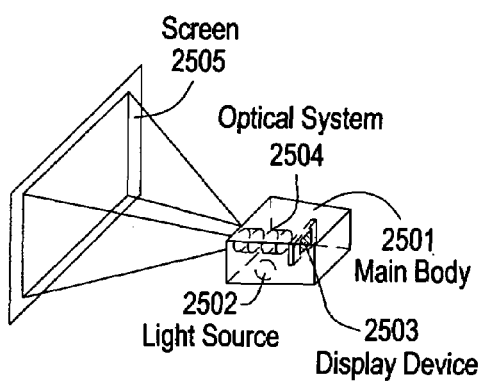

FIG. 22F shows a front projector, which is composed of a main body 2501, a light source 2502, a display device 2503, an optical system 2504, and a screen 2505. The present invention is applicable to the display device 2502 and other signal controlling circuits.

As described above, the application range of the present invention is so wide that it is applicable to electronic equipment of every field. The electronic equipment of this embodiment can be obtained by any structure resulting from combinations of Embodiments 1 through 25.

The present invention is characterized in that the same NTFT can form both the GOLD structure and the LDD structure and which one is to form is determined by controlling the voltage of a first wiring line provided under an active layer. In other words, the GOLD structure and the LDD structure can be formed on the same substrate without increasing the number of steps or complicating the process.

Therefore circuits having optimal functions can be arranged in accordance with the respective specifications required for the circuits, thus greatly improving the performance and reliability of a semiconductor device such as an AM-LCD and electronic equipment that has the AM-LCD as a display.

A high dielectric constant film such as a tantalum oxide film is used as dielectric of a storage capacitor in a pixel matrix circuit, whereby the storage capacitor can have a large capacity with a small area. Therefore, even if the AM-LCD is 1 inch or less in diagonal size, a sufficient storage capacitor is ensured without lowering the aperture ratio.

What is claimed is:

1. A semiconductor device having a pixel matrix circuit that includes a pixel TFT and a storage capacitor:
    wherein the pixel TFT has a channel formation region formed over a first wiring line with a first insulating layer interposed therebetween, and has a low concentration impurity region that is in contact with the channel formation region and overlaps the first wiring line;
    wherein a gate electrode is formed over the channel formation region with a second insulating layer interposed therebetween;
    wherein the gate electrode does not overlap the low concentration impurity region;
    wherein the storage capacitor is formed:
        from a capacitor wiring line,
        from a semiconductor region that has the same composition as the channel formation region or the low concentration impurity region, and
        from a part of the first insulating layer;
    wherein the first wiring line and the capacitor wiring line are formed on the same layer, and
    wherein the shortest distance between the channel formation region and the first wiring line is longer than the shortest distance between the capacitor wiring line and the semiconductor region.

2. A semiconductor device according to claim 1,
    wherein the first wiring line is appropriately a conductive film mainly containing an element selected from the group consisting of tantalum (Ta), chromium (Cr), titanium (Ti), tungsten (W), molybdenum (Mo), and silicon (Si), or an alloy film or silicide film containing the above elements in combination, or a laminate of the conductive films, the alloy films, or the silicide films.

3. A semiconductor device according to claim 1,
    wherein the channel formation region of the pixel TFT and the semiconductor region of the storage capacitor are formed of the same semiconductor layer.

4. A semiconductor device according to claim 1,
    wherein the first insulating layer is appropriately an oxide or halogenated compound containing an element selected from the group consisting of tantalum (Ta), titanium (Ti), barium (Ba), hafnium (Hf), bismuth (Bi), tungsten (W), thorium (Th), and lead (Pb).

5. A semiconductor device according to claim 1,
    wherein the first wiring line is in floating state.

6. A semiconductor device according to claim 1,
    wherein the first wiring line is kept at the lowest power supply electric potential.

7. A semiconductor device according to claim 1,
    wherein the pixel TFT is connected to a source wiring line and a gate wiring line, and the storage capacitor is formed under the source wiring line and/or the gate wiring line.

8. A semiconductor device, wherein the semiconductor device according to claim 1 is an active matrix liquid crystal display or an active matrix EL display.

9. A semiconductor device, wherein the semiconductor device according to claim 1 is a video camera, a digital camera, a projector, a projection TV, a goggle type display, an automobile navigation system, a personal computer, or a portable information terminal.

10. A semiconductor device according to claim 1,
    wherein a cross section of the first wiring line is taper shape.

11. A semiconductor device according to claim 1,
    wherein a cross section of the capacitor wiring line is taper shape.

12. The semiconductor device according to claim 1,
    wherein the insulating layer comprises a first insulating layer and a second insulating layer.

13. A semiconductor device according to claim 1, wherein the first wiring line and the gate electrode have the same electric potential.

* * * * *

UNITED STATES PATENT AND TRADEMARK OFFICE
CERTIFICATE OF CORRECTION

PATENT NO. : 7,276730 B2  Page 1 of 1
APPLICATION NO. : 09/837877
DATED : October 2, 2007
INVENTOR(S) : Shunpel Yamazaki et al.

It is certified that error appears in the above-identified patent and that said Letters Patent is hereby corrected as shown below:

TITLE PAGE, ITEM (56): FOREIGN PAT. DOCS,

Delete the first listing of "JP 02-666293 6/1997".

"JP 2666293 06/1997" should read --JP 2666293  10/22/1997--.

Signed and Sealed this

Twenty-fifth Day of December, 2007

JON W. DUDAS
*Director of the United States Patent and Trademark Office*